(12) United States Patent
Gerhard et al.

(10) Patent No.: US 6,842,284 B2
(45) Date of Patent: Jan. 11, 2005

(54) OBJECTIVE WITH LENSES MADE OF A CRYSTALLINE MATERIAL

(75) Inventors: Michael Gerhard, Aalen (DE); Daniel Krähmer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/740,125

(22) Filed: Dec. 17, 2003

(65) Prior Publication Data

US 2004/0179272 A1 Sep. 16, 2004

Related U.S. Application Data

(62) Division of application No. 10/199,503, filed on Jul. 18, 2002, now Pat. No. 6,697,199.

(30) Foreign Application Priority Data

Jul. 18, 2001 (DE) .......................................... 101 33 841

(51) Int. Cl.[7] .............................. G02B 5/30; B29D 11/00
(52) U.S. Cl. ...................... 359/499; 359/497; 264/1.21; 117/2
(58) Field of Search ................................ 359/494–499, 359/256, 352, 355; 264/1.21; 117/1, 2

(56) References Cited

U.S. PATENT DOCUMENTS

| | | | | |
|---|---|---|---|---|
| 5,305,138 A | * | 4/1994 | Freedenberg et al. | 359/355 |
| 5,781,336 A | * | 7/1998 | Coon et al. | 359/355 |
| 6,201,634 B1 | | 3/2001 | Sakuma et al. | 359/322 |
| 6,208,459 B1 | | 3/2001 | Coon et al. | 359/355 |
| 2003/0011893 A1 | | 1/2003 | Shiraishi et al. | 359/726 |
| 2003/0025894 A1 | | 2/2003 | Owa et al. | 355/67 |
| 2003/0086071 A1 | | 5/2003 | McGuire, Jr. | 355/71 |
| 2004/0036971 A1 | * | 2/2004 | McGuire, Jr. | 359/499 |

FOREIGN PATENT DOCUMENTS

| | | |
|---|---|---|
| DE | 199 39 088 A1 | 2/2000 |
| DE | 199 29 701 A1 | 5/2000 |
| DE | 101 23 725.1 | 11/2002 |
| DE | 101 27 320.7 | 12/2002 |
| EP | 0 857 985 A1 | 8/1998 |
| EP | 0 937 999 A1 | 8/1999 |
| EP | 1 006 373 A2 | 6/2000 |

OTHER PUBLICATIONS

Burnett J H et al: "Intrinsic Birefringence in Calcium Fluoride and Barium Fluoride"; Physical Review B, Condensed Matter; American Institute of Physics, NY, USA; vol. 64, Nr. 24, Dec. 15, 2001, pp. 241102–1 through 241102–4.
Database Internet Online! archival copy from NIST, Jul. 12, 2002; Burnett: "Minimizing spatial dispersion induced birefringence in crystals used for precision optics by using mixed crystals of materials with the opposite sign of birefringence"; retrieved from http://physics. nist.gov/divisions/div842/gp3/duvmatchar/birefring.html.

* cited by examiner

Primary Examiner—Georgia Epps
Assistant Examiner—M. Hasan
(74) Attorney, Agent, or Firm—Darby & Darby

(57) ABSTRACT

An objective (1), in particular for a microlithography projection apparatus, has lenses or lens parts falling into at least two groups. The first group (3) is made of a first crystalline material and the second group (5) is made of a second crystalline material. In the first group (3), an outermost aperture ray (15) is subject to a first optical path difference between two mutually orthogonal states of linear polarization; and the same outermost aperture ray is subject to a second optical path difference in the second group (5). The two different crystalline materials are selected so that the first and second optical path difference approximately compensate each other. A suitable selection consists of calcium fluoride for the first and barium fluoride for the second crystalline material.

11 Claims, 14 Drawing Sheets

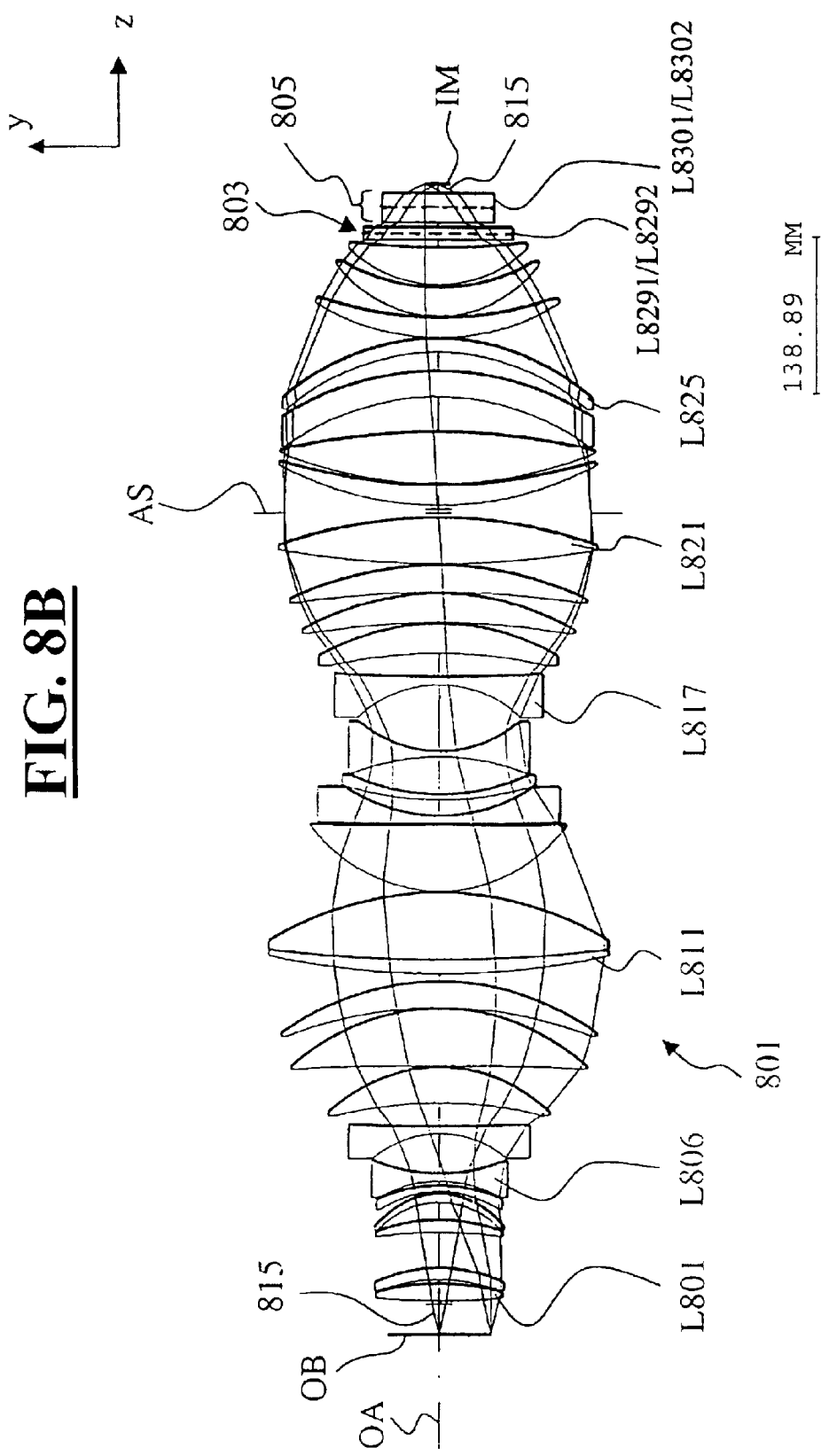

OBJECTIVE WITH LENSES MADE OF A CRYSTALLINE MATERIAL

This application is a division of U.S. patent application Ser. No. 10/199,503 filed Jul. 18, 2002, now U.S. Pat. No. 6,697,199. The present invention relates to an objective lens system (hereinafter referred to as "objective"), in particular for a projection apparatus used in microlithography, with at least a first group of lenses or parts of lenses made of a first crystalline material and at least a second group of lenses or parts of lenses made of a second crystalline material.

BACKGROUND OF THE INVENTION

The present invention relates to an objective lens system (hereinafter referred to as "objective"), in particular for a projection apparatus used in microlithography, with at least a first group of lenses or parts of lenses made of a first crystalline material and at least a second group of lenses or parts of lenses made of a second crystalline material.

Objectives of the aforementioned kind are known for example from the German patent application DE 199 29 701 A1 by the applicant of the present invention. In one embodiment, it is proposed to use calcium fluoride in parallel with barium fluoride as lens materials. In that particular embodiment, calcium fluoride takes the place of crown glass and barium fluoride takes the place of flint glass to achieve the desired achromatic lens properties.

Projection objectives in the same generic category with lenses made of two different fluoride crystals are also known from the German patent application DE 199 39 088 A1. Fluoride crystals are chosen in these cases because of their comparatively high transmissivity for wavelengths shorter than 200 nanometers. Due to the different Abbé numbers of the fluoride crystals used in the lenses, it is possible to achieve a chromatic correction of the projected image.

In the aforementioned references, the birefringent properties of the crystals are of no concern in the optical design of the objectives.

According to a concept known from U.S. Pat. No. 6,201,634, in the production of fluoride crystal lenses, the lens axes should ideally be aligned orthogonal to the {111} planes of the fluoride crystals in order to minimize stress-induced birefringence. However, in proposing this concept, the aforementioned U.S. Patent implicitly assumes that fluoride crystals are not intrinsically birefringent.

However, as described in the Internet publication "Preliminary Determination of an Intrinsic Birefringence in $CaF_2$," by John H. Burnett, Eric L. Shirley, and Zachary H. Levine of the National Institute of Standards and Technology (NIST), Gaithersburg, Md. (posted on May 7, 2001), single crystal ingots of calcium fluoride also exhibit birefringence that is not stress-induced, i.e., intrinsic birefringence. According to the measurements presented in that study, a light ray traveling in the <110> direction of the calcium fluoride crystal is subject to a birefringence that amounts to. 6.5±0.4 nm/cm at a wavelength of λ=156.1 nm, to 3.6±0.2 nm/cm at a wavelength of λ=193.09 nm, and to 1.2±0.1 nm/cm at a wavelength of λ=253.65 nm. On the other hand, if the light propagation is oriented in the <100> direction or in the <111> direction of the crystal, no intrinsic birefringence occurs in calcium fluoride, as is also predicted by theory. Thus, the intrinsic birefringence has a strong directional dependence and increases significantly for shorter wavelengths.

Measurements made by the applicant have confirmed the intrinsic birefringence of calcium fluoride as reported by the NIST researchers, except for the wavelength of λ=156.1 nm, where a birefringence of 11 nm/cm was measured for a ray propagating in the <110> direction of the crystal.

The indices for the crystallographic directions will hereinafter be bracketed between the symbols "<" and ">", and the indices for the crystallographic planes will be bracketed between the symbols "{" and "}". The crystallographic directions are perpendicular to the correspondingly indexed crystallographic planes. For example, the crystallographic direction <100> is perpendicular to the crystallographic plane {100}. Crystals with a cubic lattice structure, which includes fluoride crystals, have the principal crystallographic directions <110>, <1$\bar{1}$0>, <$\bar{1}$10>, <$\bar{1}\bar{1}$0>, <101>, <10$\bar{1}$>, <$\bar{1}$01>, <$\bar{1}$0$\bar{1}$>, <011>, <0$\bar{1}$1>, <01$\bar{1}$>, <0$\bar{1}\bar{1}$>, <111>, <$\bar{1}$11>, <1$\bar{1}$1>, <$\bar{1}\bar{1}$1>, <11$\bar{1}$>, <$\bar{1}$11>, <1$\bar{1}$1>, <11$\bar{1}$>, <100>, <010>, <001>, <$\bar{1}$00>, <0$\bar{1}$0>, and <00$\bar{1}$>. Because of the symmetries of cubic crystals, the principal crystallographic directions <100>, <010>, <001>, <$\bar{1}$00>, <0$\bar{1}$0>, and <00$\bar{1}$> are equivalent to each other. Therefore, those crystallographic directions that are oriented along one of the principal directions <100>, <010>, <001>, <$\bar{1}$00>, <0$\bar{1}$0>, and <00$\bar{1}$> will hereinafter be identified by the prefix "(100)-", and crystallographic planes that are perpendicular to these directions will also be identified by the same prefix "(100)-". Furthermore, the principal directions <110>, <$\bar{1}$10>, <1$\bar{1}$0>, <$\bar{1}\bar{1}$0>, <101>, <10$\bar{1}$>, <$\bar{1}$01>, <$\bar{1}$0$\bar{1}$>, <011>, <0$\bar{1}$1>, <01$\bar{1}$>, and <0$\bar{1}\bar{1}$> are likewise equivalent to each other. Therefore, those crystallographic directions that are oriented along one of the latter group of principal directions will hereinafter be identified by the prefix "(110)-", and crystallographic planes that are perpendicular to these directions will also be identified by the same prefix "(110)-". Finally, the principal directions <111>, <$\bar{1}\bar{1}\bar{1}$>, <$\bar{1}$11>, <$\bar{1}$1$\bar{1}$>, <1$\bar{1}\bar{1}$>, <$\bar{1}$11>, <1$\bar{1}$1>, and <11$\bar{1}$> are also equivalent to each other. Therefore, those crystallographic directions that are oriented along one of the latter group of principal directions will hereinafter be identified by the prefix "(111)-", and crystallographic planes that are perpendicular to these directions will also be identified by the same prefix "(111)-". Any statements made hereinafter in regard to one of the aforementioned principal crystallographic directions should be understood to be equally applicable to the equivalent principal crystallographic directions.

The concept of rotating the orientation of lens elements in order to compensate for the effects of birefringence is described in the not pre-published patent application DE 101 23 725.1, "Projektionsbelichtungsanlage der Mikrolithographie, Optisches System und Herstellverfahren" (Projection Apparatus for Microlithography, Optical System and Manufacturing Method), of the applicant of the present invention, and also in the not pre-published patent application DE 101 27 320.7, "Objektiv mit Fluorid-Kristall-Linsen" (Objective with Lenses Consisting of Crystalline Fluoride) of the applicant of the present invention.

OBJECT OF THE INVENTION

The present invention has the objective to provide objectives for use in a microlithography projection apparatus, in which the influence of intrinsic birefringence of the crystalline lens material is significantly reduced.

SUMMARY OF THE INVENTION

The invention meets the foregoing objective by providing an objective, in particular for a projection-apparatus used in a microlithography, with at least a first group of lenses or parts of lenses made of a first crystalline material and at least a second group of lenses or parts of lenses made of a second crystalline material. Due to the birefringent properties of the lens materials and depending on the specific configurations of the first and second groups of lenses, a light ray traversing the first lens group is subject to a first optical path difference between two mutually orthogonal states of linear polarization, while the same light ray is subject to a second optical path difference in the second group. The objective according to the present invention is designed so that in particular for a peripheral light ray (i.e., a ray traversing the border area of the lens aperture, which hereinafter will also be referred to as an outermost aperture ray) the first and second optical path differences will approximately compensate each other.

According to a preferred embodiment of the invention, the lenses or parts of lenses of the first group consist of calcium fluoride, while the lenses or parts of lenses of the second group consist of barium fluoride.

Under a more specifically defined concept of the preceding embodiment, the central axes of the lenses or lens parts of the two groups are aligned approximately along the same or equivalent principal crystallographic directions and, furthermore, equivalent principal crystallographic directions of the lenses or lens parts of the two groups are aligned approximately in the same directions.

The scope of the present invention includes a microlithography projection apparatus with an illumination system and with an objective as described above, which projects an image of a mask structure onto a light-sensitive substrate. Further included in the scope of the invention is a method of producing semiconductor elements by means of the inventive microlithography projection apparatus.

Finally, the invention also covers a method of manufacturing a lens by seamlessly joining a first plate made of a first crystalline material and a second plate made of a second crystalline material, where the seamless joint is achieved in particular by a so-called wringing fit, i.e., the ma ting between ultra-flat surfaces that will adhere to each other by molecular attraction without the use of a bonding agent. Subsequently, the joined plates are subjected to shaping and polishing operations. Due to the birefringent properties of the crystalline plates, a light ray traversing the first plate is subject to a first optical path difference between two mutually orthogonal states of linear polarization, while the same peripheral light ray is subject to a second optical path difference in the second plate. The inventive method is further characterized by the fact that the first and second optical path differences will approximately compensate each other.

In a specific embodiment of the method described in the preceding paragraph, the first plate consists of calcium fluoride and the second plate consists of barium fluoride.

Advantageous further developments and specific features of the aforedescribed embodiments of the invention may be learned from the following description as well as the attached drawings.

According to the invention, the effects of the intrinsic birefringence are minimized by using an objective that has at least two groups of lenses or lens parts. The lenses or lens parts (also collectively referred to as optical elements) of a given group are made of the same crystalline material, while the lenses or lens parts of different groups are made of different crystalline materials. A group, as the term is used herein, can be made up of one individual lens or a plurality of lenses, or also of an individual lens part or a plurality of lens parts. The term "lens parts" is used to describe, for example, individual lenses that are seamlessly joined by the above described wringing fit to form one unitary lens. In the most general sense, the term "lens parts" refers to the parts of an individual lens, where the lens axes of the lens parts are aligned in the direction of the lens axis of the individual lens. The lens materials are selected and the lenses or lens parts are designed and arranged in such a manner that an outermost aperture ray is subject to a significantly reduced optical path difference between two mutually orthogonal states of linear polarization. The overall optical path difference for the objective is represented by the sum of a first optical path difference and a second optical path difference occurring in the aperture ray while traveling through the first and second groups, respectively. The detrimental influence of the birefringence phenomenon is considered to be significantly reduced if the combined optical path difference is smaller than 30%, and particularly significant if it is smaller than 20% of the maximum value of either of the two separate path differences. The term "outermost aperture ray" refers to a light ray that traverses a diaphragm plane of the objective at a distance from the lens axis that is equal to the aperture radius of the diaphragm, so that on the image side of the objective, the ray encloses an angle with the lens axis that corresponds to the numerical aperture. The outermost aperture rays are used to characterize the inventive concept, because they normally have the largest aperture angles in relation to the lens axes and therefore suffer the most from the undesirable effects of the birefringence phenomenon.

The lenses can be, for example, refractive or diffractive lenses as well as correcting plates with free-form surface shapes. Planar-parallel plates, too, are considered as lenses if they are arranged in the light path of the objective.

The invention can be used to good advantage in projection objectives for a microlithography projection apparatus, because this application poses extremely exacting requirements on the resolution of the projection objective. The birefringence phenomenon also affects lens-testing objectives that are used to test lenses for projection objectives by measuring wave fronts of large aperture. Thus, a birefringence compensation is desirable for lens-testing objectives, too. Further possible applications exist in objectives that are used to inspect integrated circuit wafers, as well as in microscope objectives, and in objectives for illumination systems that are used to illuminate the objects that are projected or viewed with the aforementioned types of objectives.

Particularly for lenses used at wavelengths shorter than 250 nanometers, fluoride crystals such as, e.g., calcium fluoride, barium fluoride, or strontium fluoride have been found to be advantageous as lens materials.

It is a known property of calcium fluoride that it exhibits an angle-dependent intrinsic birefringence. According to measurements performed by the applicant of the present invention, a value of 11 nm/cm for the wavelength of $\lambda=156.1$ nm was found for the birefringence in a light ray traveling in the direction (110) of the crystal. Similar measurements in barium fluoride have shown that the latter, likewise, exhibits intrinsic birefringence with a comparable dependence on angular orientation, which is explained by the fact that calcium fluoride and barium fluoride belong to the same type of crystals. The measurements of birefringence performed by the applicant in barium fluoride with a ray propagating in the (110)-direction of the crystal resulted in a birefringence value of 25 nm/cm for the wavelength of $\lambda 156.1$ nm. However, it should be noted that the birefringence effect is characterized not only by its numerical amount, but also by its direction. The direction of the birefringence is defined as the direction of the so-called slow axis. For linearly polarized light, the index of refraction is greatest if the polarization is oriented in the direction of the slow axis. The inventors recognized that the axes of birefringence for light traveling in the (110)-direction of calcium fluoride and barium fluoride are orthogonal to each other, so that a light ray propagating in the (110)-direction is subject to travel path differences of opposite signs in calcium fluoride and barium fluoride for two mutually orthogonal states of polarization. This property is advantageously exploited in the present invention to achieve a reduction of the unwanted influence of the birefringence phenomenon. Through the combination of lenses or lens parts of different crystalline materials that produce light-path differences of opposite sign for two mutually orthogonal states of linear polarization in a polarized light ray, and through an optical design that is determined by the birefringent properties, it is possible to achieve at least an approximate compensation of the unwanted effects of birefringence that occur when only one crystalline material is used.

The compensation is particularly successful if the lens axes of all of the lenses or lens parts are oriented along the same principal crystallographic direction or along equivalent crystallographic directions. The lens axis may coincide, e.g., with the symmetry axis of a rotationally symmetric lens. If the lens does not have a symmetry axis, the lens axis may be defined as the centerline of an incident bundle of light rays, or as that line in respect to which the ray angles of all light rays within the lens are minimal. The lens axis of a planar-parallel plate is perpendicular to the planar lens surfaces. The lens axes are considered to coincide approximately with a principal crystallographic direction if the maximum deviation between lens axis and principal crystallographic direction is less than 5°. It is of advantage if the first and second crystalline materials belong to the same crystal type and the lens axes are oriented approximately in the same principal crystallographic direction, because the magnitudes of the birefringence effect will be distributed similarly in the lenses or lens parts. The distribution functions $\Delta n(\alpha_L, \theta_L)$ in this case are given as a function of the aperture angle $\theta_L$ and of the azimuth angle $\alpha_L$. The aperture angle $\theta_L$ represents the angle that a light ray encloses with the lens axis, while the azimuth angle $\alpha_L$ represents the angle between the projection of the light ray into a plane perpendicular to the lens axis and a fixed reference direction that runs in the same perpendicular plane and is tied to the lens.

The value of the birefringence function $\Delta n$ is equal to the difference between the refractive indices for the so-called slow axis and the so-called fast axis of two mutually orthogonal states of linear polarization of a light ray traveling in the direction defined by the aperture angle $\theta_L$ and the azimuth angle $\alpha_L$. Thus, the birefringence index $\Delta n$ represents the quotient of the optical path difference (in nanometers) divided by the length (in centimeters) of the physical light path inside the fluoride crystal. The intrinsic birefringence is dependent on the paths of the light rays and on the shape of the lens. According to the foregoing definition of $\Delta n$, the optical path difference is obtained by multiplying the birefringence index $\Delta n$ with the path length traveled by the ray inside the birefringent medium.

In cases where the birefringent properties occur, e.g., as a result of the manufacturing process of the fluoride crystal or as a result of mechanical forces acting on the lens (stress-induced birefringence), it is of course understood that the inventive problem solutions disclosed herein can likewise be used to achieve a reduction of the harmful influence of the birefringence phenomenon.

It is advantageous if the lens axes of the lenses and lens parts of the two groups are oriented along the crystallographic directions (100) or (111). The birefringence function $\Delta n$ vanishes at the aperture angle $\theta_L=0°$. The values of $\Delta n$ increase with increasing aperture angles. The distribution pattern of $\Delta n$ exhibits fourfold azimuthal symmetry if the lens axis is oriented in the crystallographic direction (100), and threefold azimuthal symmetry if the lens axis is oriented in the crystallographic direction (111). This means that for a given fixed aperture angle $\theta_O$ the birefringence distribution $\Delta n(\alpha_L, \theta_O)$ will have four local maxima and minima if the lens axis is oriented in the crystallographic direction (100), and three local maxima and minima if the lens axis is oriented in the crystallographic direction (111). This applies to calcium fluoride as well as to barium fluoride.

It is particularly advantageous if equivalent principal crystallographic directions are oriented in approximately equal directions for the lenses or lens parts of the at least two groups, so that the maximum deviations are smaller than 10° between corresponding principal crystallographic directions. Thus, the lenses or lens parts of the first and second groups will have approximately the same crystallographic orientation.

Although the largest aperture angles in projection lenses occur typically for the outermost aperture rays, it is also conceivable to compensate the optical path differences for two mutually orthogonal states of linear polarization for other rays, such as for example principal rays (i.e., rays traversing the center of a diaphragm plane), by using two groups of lenses or lens parts made of two different crystalline materials whose birefringent behaviors are complementary, such as for example barium fluoride and calcium fluoride. If one considers pupil imaging instead of field imaging, the outermost aperture ray will be equivalent to the principal ray with the largest object height, because this principal ray has the same ray height (perpendicular distance from the lens axis) in the object plane as the border of the object field. Therefore, the present observations which relate to the outermost aperture rays can also be applied to the compensation of the optical path differences for the outermost principal rays.

The detrimental influence of birefringence for the outermost aperture rays will be significantly reduced, if the reference directions of the individual lenses or lens parts of the two groups are oriented in such a way that the birefringence distribution functions run conjugate to each other, and if the lenses or lens parts are rotated about their lens axes in such a manner that the reference directions are aligned with a deviation of no more than 10°. Two birefringence distribution functions are said to run conjugate to each other, if the local minima of the birefringence values occur approximately at the same azimuth angles. With this arrangement of the lenses, the respective azimuthal sectors of maximum and minimum birefringence occur at the same azimuth angles relative to a fixed reference direction that is tied, for example to the image plane. For a bundle of rays falling on an image point in the image plane of the objective, the distribution of the optical path differences for two mutually orthogonal states of linear polarization is thus nearly independent of the azimuth angle of the rays.

In the arrangement just described, it is sufficient if the first group consists of only an individual lens or a part of an individual lens and the second group, likewise, consists of only an individual lens or a part of an individual lens. The thicknesses and radii of the lenses should be chosen to achieve approximately opposite path differences in the two lenses or lens parts for two mutually orthogonal states of linear polarization in the outermost aperture ray.

The detrimental influence of the birefringence effect can also be compensated with an arrangement where the two groups with the different crystalline materials each have at least two lenses or lens parts, that are oriented within their groups in a rotated position about the lens axis. As the birefringence distribution functions of the lenses are dependent on the azimuth angle, the rotated arrangement will reduce the maximum value of the optical path differences by 20%–25% in comparison to the non-rotated-arrangement of the lenses in a group for a bundle of rays falling on a point in the image plane.

In particular, with the rotated arrangement of the lenses or lens parts within the group, the distribution of the optical path differences caused by the group can be made less dependent on the azimuth angles of the rays of the bundle, so that the distribution function will be nearly symmetric relative to azimuthal rotation. The azimuth angle of each ray is defined as the angle between the projection of the ray into the image plane and a fixed reference direction in the image plane. Finally, by combining the two groups that are made of different crystalline materials, the nearly symmetric respective distributions of optical path differences in the first and second group will compensate each other.

If the reference directions are oriented in such a manner that the birefringence distributions run conjugate to each other, it is advantageous to set the angle of rotation Y between two reference directions of lenses or lens parts of a group as follows:

$$Y = \frac{360°}{k \cdot n} + m \cdot \frac{360°}{k} \pm 10°$$

In this equation, k stands for the degree of azimuthal symmetry, n for the number of lenses in a group, and m of an arbitrary integer number. The tolerance of ±10° allows for the fact that the angles of rotation may deviate from the theoretically ideal angles, so that other constraints can be taken into account in the fine adjustment of the objective. A deviation from the ideal angle of rotation leads to non-optimized azimuthal compensation of the optical path differences of the lenses in a group. This can, however, be tolerated within certain limits.

For lenses or lens parts whose lens axes are oriented in the crystallographic direction (100), the angles of rotation according to the foregoing equation are determined as:

$$Y = \frac{90°}{n} + m \cdot 90° \pm 10°$$

If the group is made up of two lenses with (100)-orientation, the angle of rotation between the two lenses will ideally be 45° or 135°, 225°, . . . etc.

Analogously, for lenses or lens parts whose lens axes are oriented in the crystallographic direction (111), the equation angles of rotation are determined as:

$$Y = \frac{120°}{n} + m \cdot 120° \pm 10°$$

If the outermost aperture ray has similar aperture angles in the lenses or lens parts of the two groups, it is advantageous to adapt the thicknesses and radii of the lenses to the birefringent properties of the crystalline material, among other considerations. The birefringence effect in calcium fluoride and barium fluoride is greatest in the crystallographic direction (110). Thus, the birefringence value for light propagating in the (110) direction represents the reference quantity. To achieve an optimum of compensation of the two groups, the ratio between the respective path lengths of a ray in the first and second group should be approximately the reciprocal of the ratio between the respective birefringence values of the first and second crystalline materials in the crystallographic direction (110). The light path of a ray in a group equals the sum of the light paths for that ray in the individual lenses or lens parts of the group. A good degree of compensation is achieved in an arrangement where for similar aperture angles within the lenses or lens parts of the two groups, with a variation of less than 20% relative to the maximum aperture angle, the quotient of the ratio between the respective light paths for a ray in the first and second group divided by the reciprocal ratio of the respective birefringence values of the crystal materials relative to the (110)-direction lies in a range between 0.8 and 1.2.

The detrimental influence of birefringence is reduced with particular effectiveness if the two groups are arranged adjacent to each other, because in this case the rays of a bundle will have similar azimuth angles in the two groups. In particular, the lens parts of two groups can be seamlessly joined, e.g., by wringing. This produces an individual lens that has two groups of lens parts.

A determining factor for the lenses of a group is for example that an outermost aperture ray of a bundle of rays has similar aperture angles within the lenses of the group. Advantageously, the aperture angle of the outermost aperture ray within these lenses is larger than 20° and, more particularly, larger than 25°. These large aperture angles are found in objectives with large numerical apertures on the image side, exceeding in particular a value of 0.7, so that compensation measures are necessary to reduce the detrimental influence of birefringence.

Large aperture angles in lenses occur mainly in the proximity of field planes, particularly in the proximity of the image plane. The groups provided for the compensation should therefore preferably be arranged in the proximity of the field planes. Ideally, one of the two groups includes the lens closest to the image plane.

The magnitude of the intrinsic birefringence increases noticeably when working with shorter wavelengths. For example in comparison to a wavelength of 248 nm, the intrinsic birefringence is more than twice as large at a wavelength of 193 nm, and more than five times as large at a wavelength of 157 nm. The present invention is therefore used with particular advantage for light with a wavelength shorter than 200 nm, and in particular shorter than 160 nm.

Objectives of the kind proposed by the present invention are used advantageously as projection objectives in microlithography projection apparatus which include a light source, an illumination system, a mask-positioning system with a mask carrying a structure, the projection objective, and an object-positioning system to hold a light-sensitive substrate. In this projection apparatus, the objective projects an image of the mask structure onto the light-sensitive substrate.

The microlithography apparatus of the foregoing description serves to manufacture micro-structured semiconductor components.

The scope of the invention also includes a method of manufacturing a lens. In a first step of the method, a first plate and at least one second plate are seamlessly joined to form a blank, and in a second step the lens is formed from the blank by known production methods. The first and second plates consist of different crystalline materials. The crystalline materials, the crystallographic orientations, and the plate thicknesses are selected so that for a light ray that is subject in the first plate to a first optical path difference between two mutually orthogonal state of linear polarization, and in the second plate to a second optical path difference between two mutually orthogonal state of linear polarization, the first and second optical path difference approximately compensate each other, so that the resultant optical path difference is less than 30%, and in particular less than 20%, of the maximum amount of either of the individual optical path differences.

A very good compensation is obtained, e.g., with calcium fluoride and barium fluoride as crystal materials, because they have similar birefringent properties, while at the same time, their directions of birefringence in the crystallographic direction (110) are orthogonal to each other.

It is advantageous if the directions perpendicular to the first and second plates (also referred to as normal vectors of the plates) are oriented approximately in the same principal crystallographic direction or in equivalent principal crystallographic directions. The deviation from the principal crystallographic direction should not exceed a limit of about 5°.

The crystallographic direction (100) and (111) are advantageous as directions for the normal vectors of the plate surfaces, because the birefringence effect vanishes for light rays in these exact directions.

A good degree of compensation for the two plates is achieved if the equivalent crystallographic directions are oriented in approximately equal directions for the first and second plates, i.e., if the crystals have the same orientation. Deviations up to about 10° can be tolerated.

Near-perfect compensation is achieved if, in addition, the thicknesses of the first and second plates are suitably adapted. The deciding factor for the plate thicknesses lies in the respective magnitudes of the birefringence indices for the first and second crystalline materials in the crystallographic direction (110). The ratio between the thickness of the first plate and the thickness of the second plate should be approximately the reciprocal of the ratio between the first and second birefringence index. The deviation between the aforementioned ratio and reciprocal ratio should be no more than 20% of the maximum value of the two ratios.

The lens-manufacturing method of the foregoing description can be used to produce lenses for applications in objectives, particularly in projection objectives used in microlithography.

BRIEF DESCRIPTION OF THE DRAWINGS

The following detailed explanation of the invention is based on the attached drawings, wherein:

FIG. 8B represents a lengthwise section of a refractive projection objective according to the fifth and sixth embodiments of the invention;

DESCRIPTION OF PREFERRED EMBODIMENTS

Figure 1:
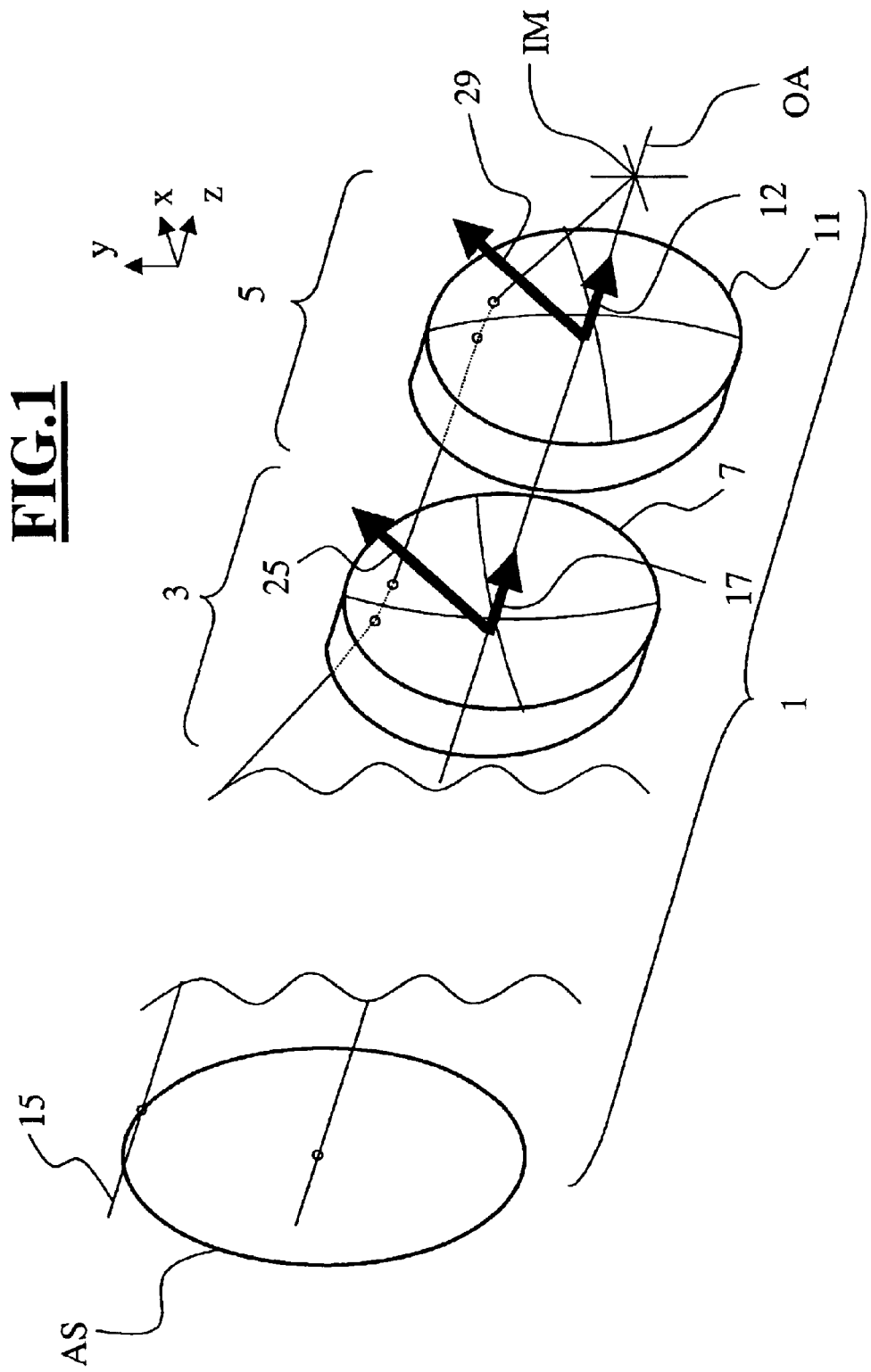
FIG. 1 represents a schematic view of a first embodiment.

FIG. 1 schematically illustrates a first embodiment of an objective 1 according to the invention. The objective 1 has a first group 3 with the lens 7, and a second group 5 with the lens 11, in addition to further lenses that are not shown in the drawing. The lens 7 consists of calcium fluoride crystal, while the lens 11 consists of barium fluoride crystal. The lens axis 17 of the rotationally symmetric negative lens 7 as well as the lens axis 12 of the rotationally symmetric positive lens 11 are aligned in the direction of the optical axis OA. The lens 7 is made from a calcium fluoride block in such a manner that the lens axis 17 is aligned in the crystallographic direction <111>. Likewise in the lens 11, which is made from a barium fluoride block, the lens axis is aligned in the crystallographic direction <111>. In the lenses 7 and 11, fixed reference directions 25 and 29 are defined in the lenses. Relative to the fixed reference directions, the birefringence distributions of the lenses 7 and 11 are conjugate to each other. In the embodiment of FIG. 1, the reference directions 25 and 29 point in the same direction, so that equivalent principal crystallographic directions of the two lenses 7 and 11 are likewise pointing in the same directions, such as for example the direction <100> in lens 7 and lens 11. The reference directions 25 and 29 are rotated in relation to the x-direction of the image plane IM. An outermost aperture ray 15, whose height (vertical distance from the lens axis) in the diaphragm plane equals the height of the diaphragm opening AS, is subject to a first optical path difference in the first group 3, and to a second optical path difference in the second group 5, for two mutually orthogonal states of linear polarization. As the calcium fluoride crystal and the barium fluoride crystal are arranged with the same orientation in the illustrated objective of FIG. 1, the optical path differences partially compensate each other. The outermost peripheral ray intercepts the optical axis OA in the image plane IM.

Figure 2:
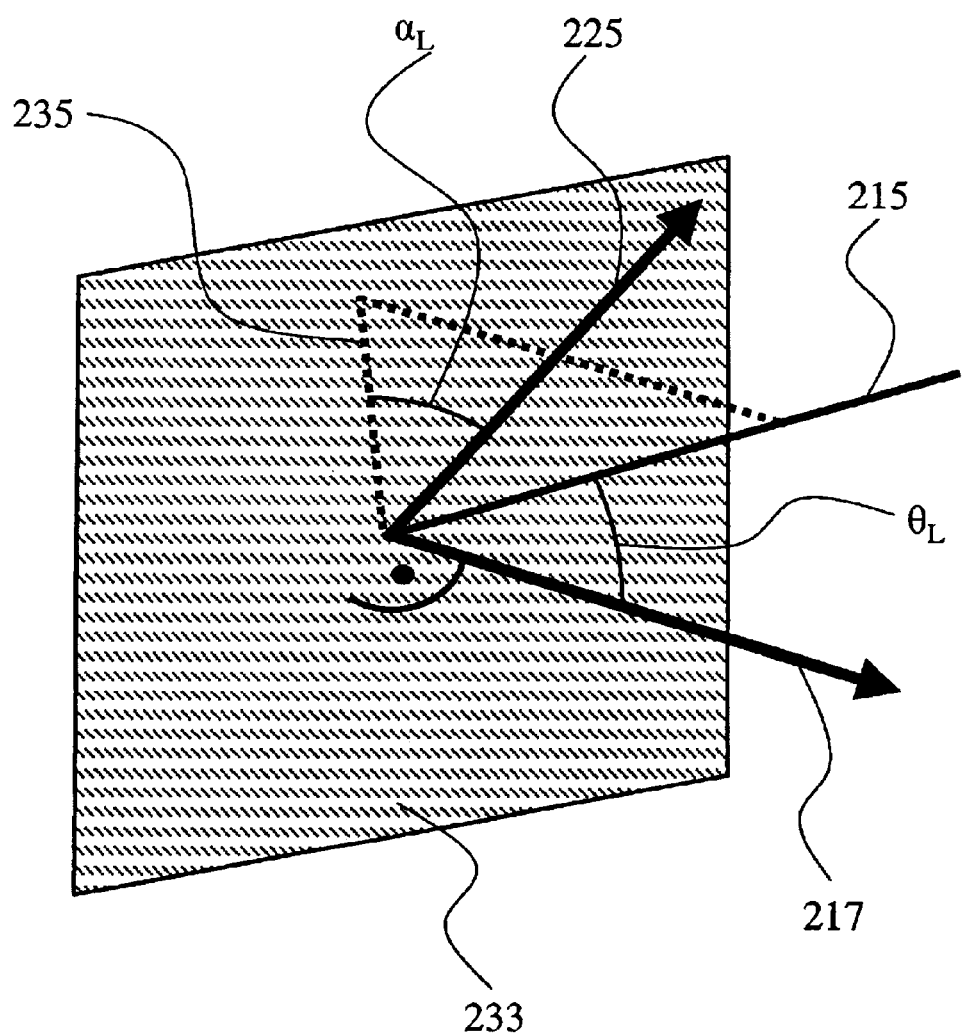
FIG. 2 illustrates the definition of the aperture angle and the azimuth angle in a schematic view.

FIG. 2 illustrates the definitions (as used herein) of the aperture angle $\theta_L$ and azimuth angle $\alpha_L$ of an aperture ray 215. The aperture angle $\theta_L$ is defined as the angle between the aperture ray 215 and the direction 217 that runs parallel to the lens axis. The broken line 235 in FIG. 2 represents the projection of the aperture ray 215 into the plane 233 that extends perpendicular to the lens axis. The azimuth angle $\alpha_L$ is defined as the angle between the projected direction 235 and the direction 225 that runs parallel to the fixed reference direction of the lens.

FIGS. 3 to 6 illustrate the birefringence distributions in calcium fluoride and barium fluoride for lenses whose lens axes are oriented in the crystallographic directions (100) and (111). Based on measurements made by the applicant, it was found that calcium fluoride has a birefringence index of 11 nm/cm and barium fluoride has a birefringence index of 25 nm/cm for light rays with a wavelength of $\lambda=157$ nm traveling in the crystallographic direction <110>. However, the optical path differences for two mutually orthogonal states of linear polarization in calcium fluoride and barium fluoride have opposite signs for an aperture ray traveling in an equivalent direction in the two media. Using the aforementioned measured values as normalizing reference, the birefringence distribution function $\Delta n\ (\alpha_L, \theta_L)$ of a calcium fluoride lens or a barium fluoride lens can be theoretically calculated as a function of the crystallographic orientation. To perform this calculation, one uses the formal procedures known in the field of crystal optics for the calculation of the index ellipsoids as a function of the light-ray direction. The theoretical foundations may be found, e.g., in "Lexikon der Optik", Spektrum Akademischer Verlag Heidelberg Berlin, 1999, under the term "Kristalloptik".

Figure 3A:
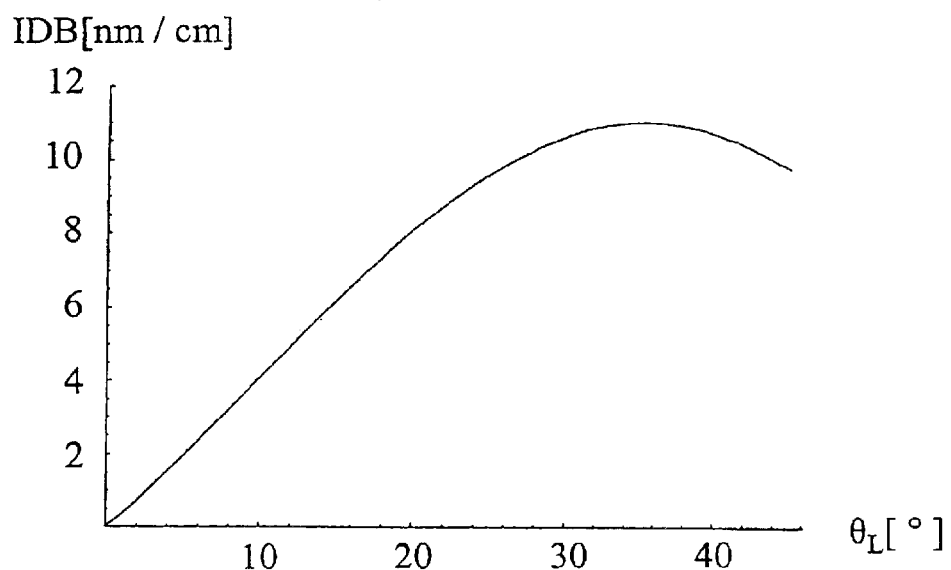
FIGS. 3A–3C illustrate in different diagrams the distribution function for the birefringence in lenses or lens parts of calcium fluoride, whose lens axes are oriented in the crystallographic direction (111)
Figure 3B:
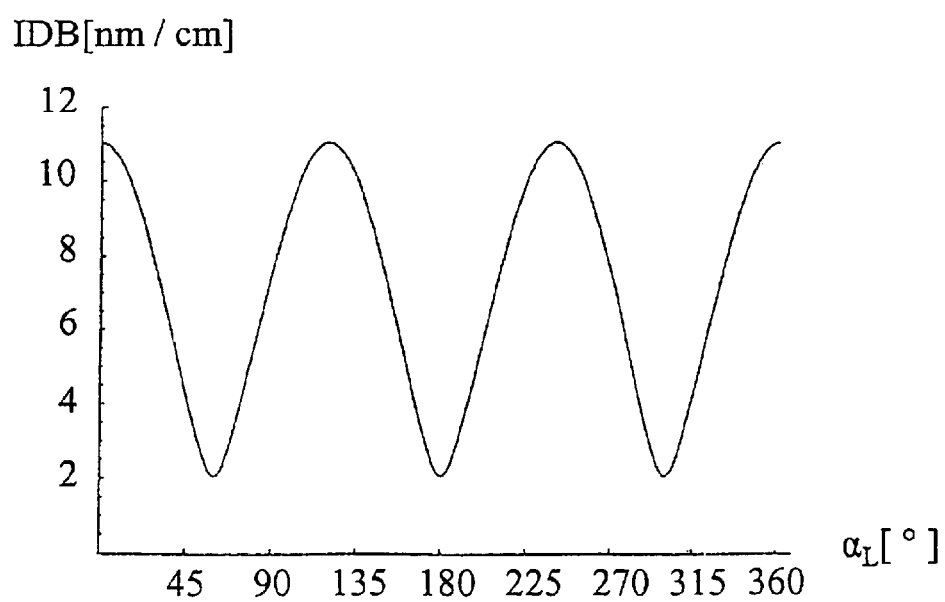
Figure 3C:
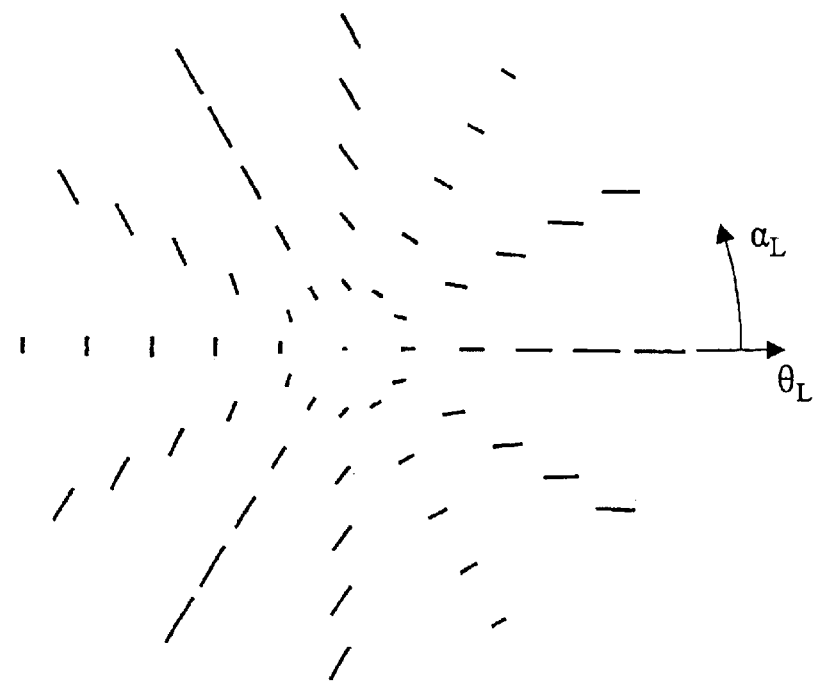

The diagrams in FIGS. 3A to 3C illustrate how the birefringence index of lenses or lens parts of calcium fluoride, whose lens axes point in the crystallographic direction (111), depends on the angles $\alpha_L$ and $\theta_L$.

FIG. 3A shows the magnitude of the intrinsic birefringence as a function of the aperture angle $\theta_L$ for an azimuth angle $\alpha_L=0°$. The value of the intrinsic birefringence of 11 nm/cm at an aperture angle of $\theta_L=35°$ corresponds to the measured value, because the crystallographic direction (110) encloses an angle of 35° with the crystallographic direction (111). The curve in the graph of FIG. 3A was calculated according to the formulas known from the field of crystal optics.

FIG. 3B shows the magnitude of the intrinsic birefringence as a function of the azimuth angle $\alpha_L$ for an aperture angle of $\theta_L=35°$. The threefold azimuthal symmetry is evident. Minimum amounts of birefringence are found at the azimuth angles $\alpha_L=60°$, 180°, 300°. The fixed reference direction is set so that a maximum value of the birefringence lies at $\alpha_L=0°$.

The diagram of FIG. 3C represents the birefringence distribution $\Delta n(\alpha_L, \theta_L)$ for different individual light rays in a range of angles $\alpha_L, \theta_L$. Each of the short lines represents the magnitude and direction of the birefringence for a light ray whose direction is defined by the aperture angle $\theta_L$ and the azimuth angle $\alpha_L$. The length of the lines is in proportion to the magnitude of the birefringence or, as another way of expressing the same fact, proportional to the difference between the lengths of the principal axes of the intersectional ellipse, while the direction of the lines corresponds to the orientation of the longer principal axis of the intersectional ellipse. The intersectional ellipse is defined as the intersection between the index ellipsoid for a light ray in the direction $(\alpha_L, \theta_L)$ and a plane that extends perpendicular to the direction of the light ray and cuts through the center of the index ellipsoid. The directions as well as the lengths of the lines show the threefold symmetry of the distribution. The length of the lines, and thus the magnitude of the birefringence, is greatest at the azimuth angles of 0°, 120°, and 240°.

Figure 4C:
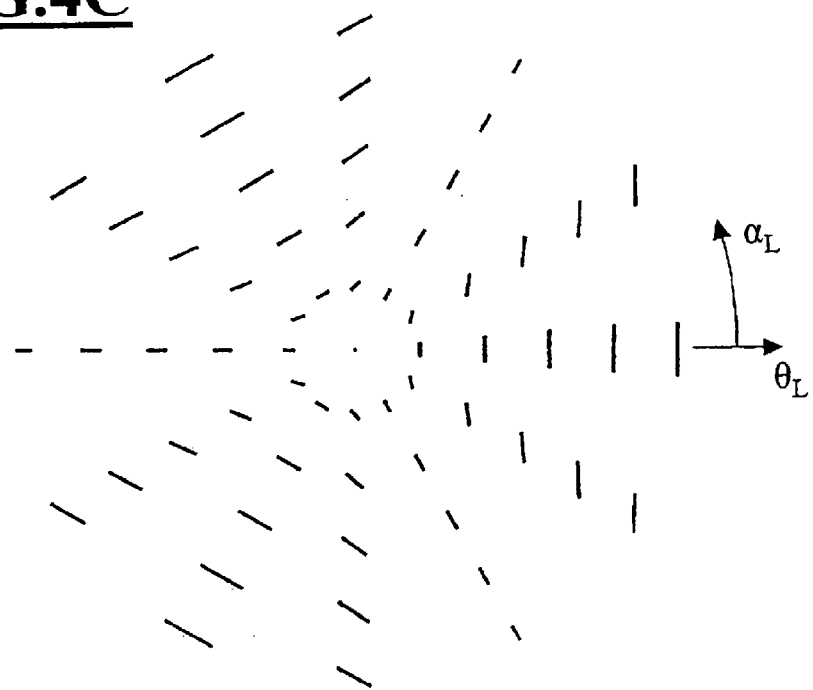
FIGS. 4A–4C illustrate in different diagrams the distribution function for the birefringence in lenses or lens parts of barium fluoride, whose lens axes are oriented in the crystallographic direction (111)
Figure 4A:
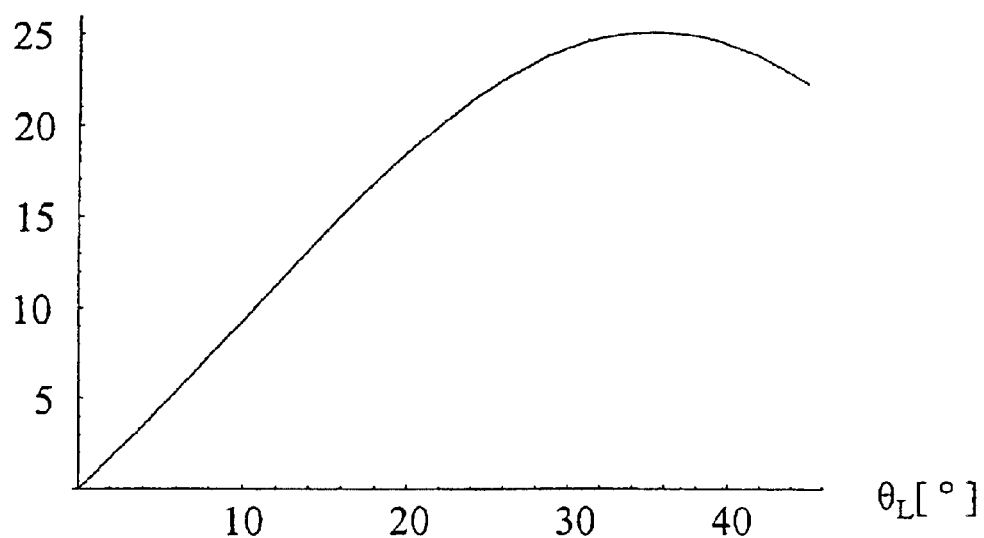
Figure 4B:
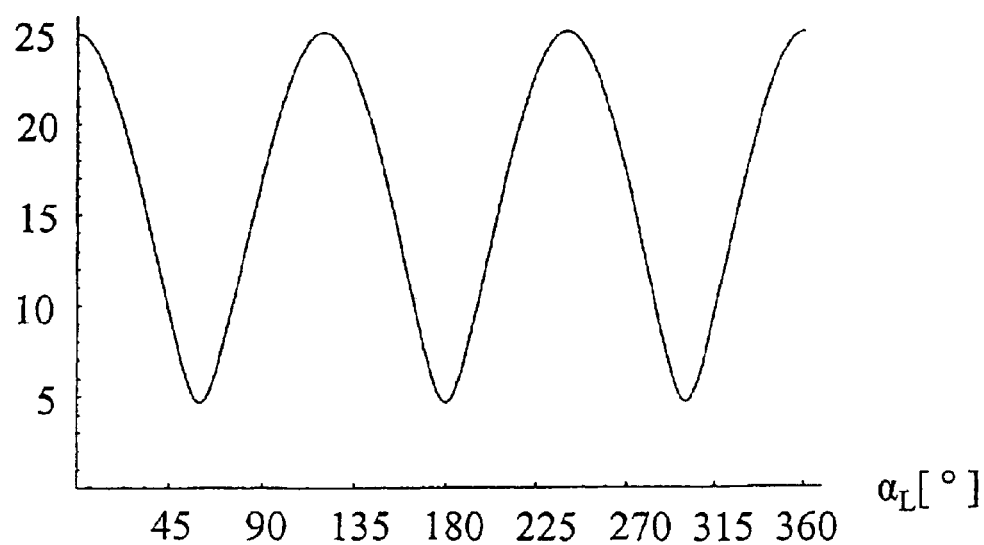

Analogous to FIGS. 3A to 3C, the FIGS. 4A to 4C illustrate the birefringence distributions for lenses or lens parts of barium fluoride, whose lens axes are oriented in the crystallographic direction (111). Except for the different maximum values of the birefringence, the curves of FIGS. 4A, 4B are conjugate to the curves of FIGS. 3A, 3B. The fixed reference directions are set so that the minimum amounts of birefringence occur at the same azimuth angles in calcium fluoride as in barium fluoride. Comparing FIG. 3C to FIG. 4C, it becomes clear that on the one hand the distributions are conjugate to each other, and on the other hand the directions of the birefringence for the individual light-ray directions in calcium fluoride are orthogonal to the directions of the birefringence for the corresponding light-ray directions in barium fluoride.

Figure 5A:
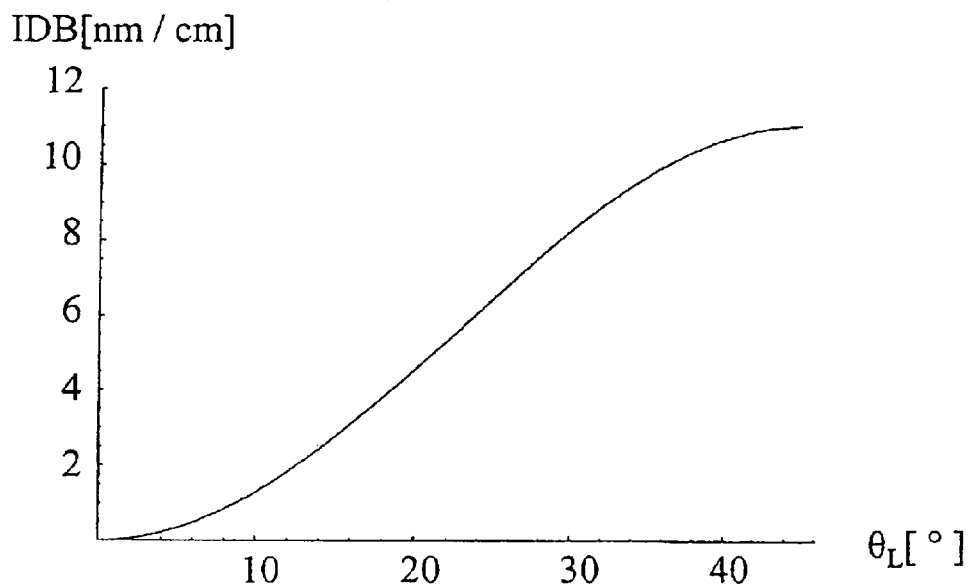
FIGS. 5A–5C illustrate in different diagrams the distribution function for the birefringence in lenses or lens parts of calcium fluoride, whose lens axes are oriented in the crystallographic direction (100)
Figure 5B:
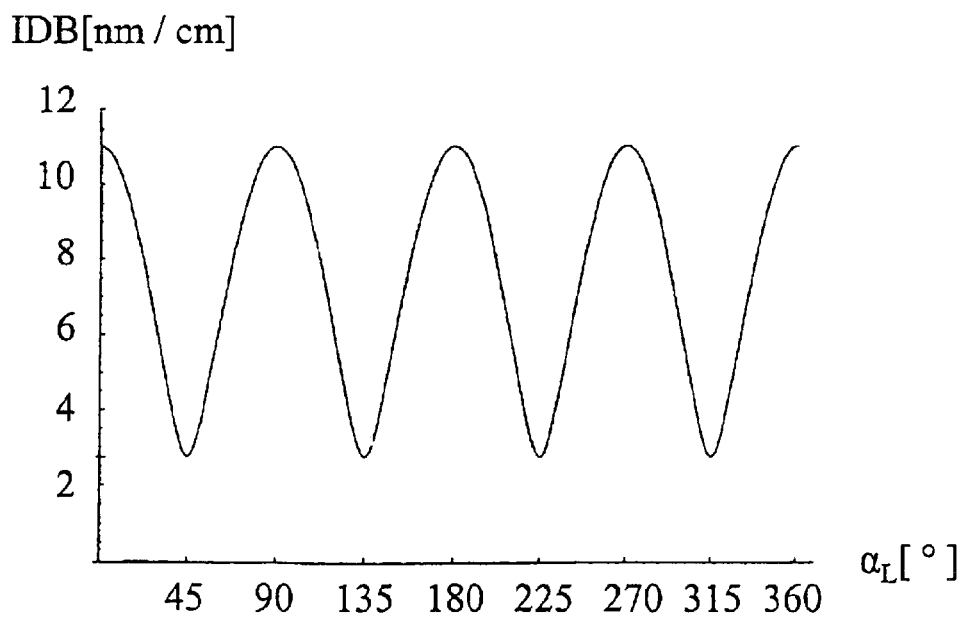
Figure 5C:
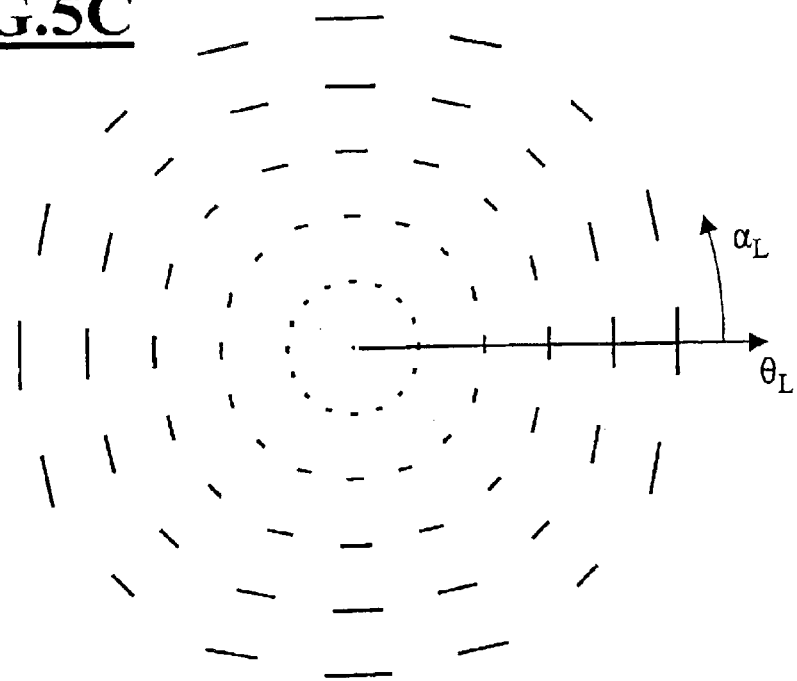

The diagrams in FIGS. 5A to 5C illustrate how the birefringence index of lenses or lens parts of calcium fluoride, whose lens axes point in the crystallographic direction (100), depends on the angles $\alpha_L$ and $\theta_L$.

FIG. 5A shows the magnitude of the intrinsic birefringence as a function of the aperture angle $\theta_L$ for an azimuth angle $\alpha_L=0°$. The value of the intrinsic birefringence of 11 nm/cm at an aperture angle of $\theta_L=45°$ corresponds to the measured value, because the crystallographic direction (110) encloses an angle of 45° with the crystallographic direction (100). The curve in the graph of FIG. 5A was calculated according to the formulas known from the field of crystal optics.

FIG. 5B shows the magnitude of the intrinsic birefringence as a function of the azimuth angle $\alpha_L$ for an aperture angle of $\theta_L=45°$. The fourfold azimuthal symmetry is evident. Minimum values of the birefringence are found at the azimuth angles $\alpha_L=45°$, 135°, 225°, and 315°. The fixed reference direction is set so that a maximum value of the birefringence lies at $\alpha_L=0°$.

The diagram of FIG. 5C represents the birefringence distribution $\Delta n(\alpha_L, \theta_L)$ for different individual light rays in a range of angles $\alpha_L$, $\theta_L$. The format of the graphic representation in FIG. 5C is analogous to FIG. 3C. The directions as well as the lengths of the lines show the fourfold symmetry of the distribution. The length of the lines, and thus the magnitude of the birefringence, is greatest at the azimuth angles of 0°, 90°, 180°, and 270°.

Figure 6C:
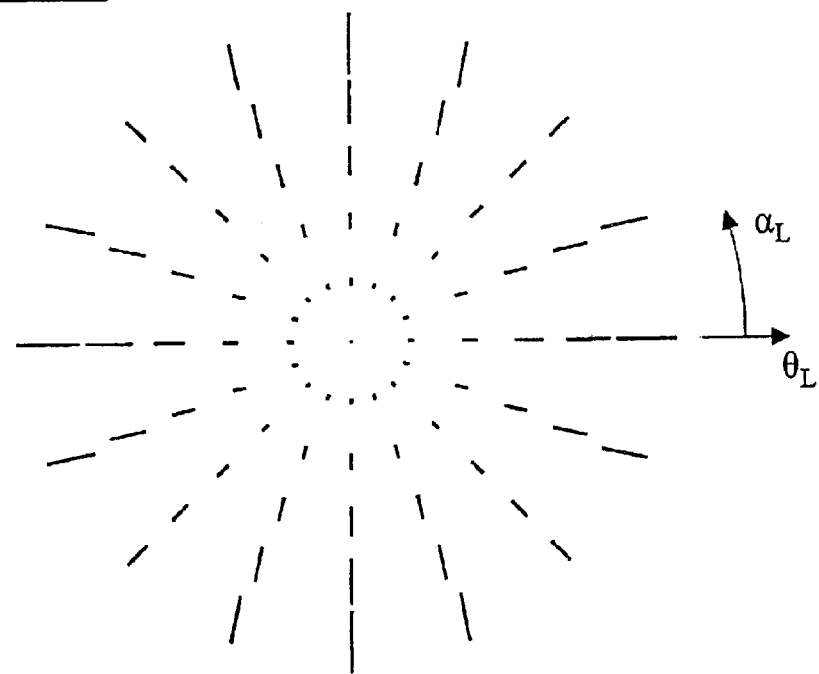
FIGS. 6A–6C illustrate in different diagrams the distribution function for the birefringence in lenses or lens parts of barium fluoride, whose lens axes are oriented in the crystallographic direction (100)
Figure 6A:
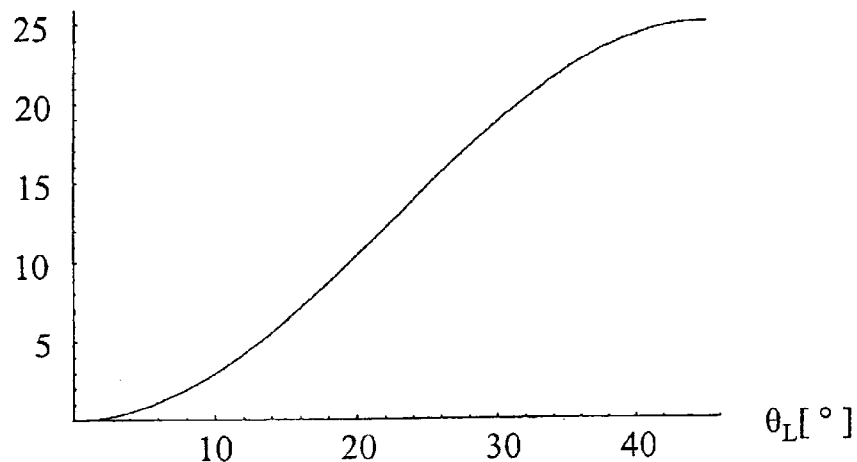
Figure 6B:
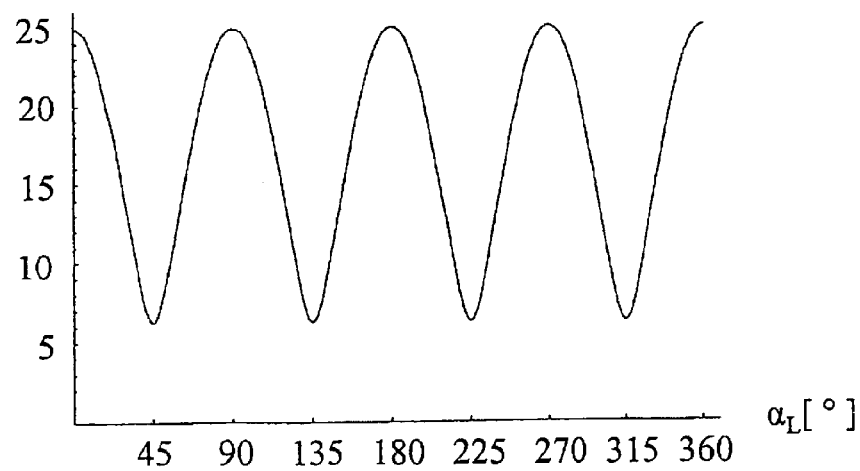

Analogous to FIGS. 5A to 5C, the FIGS. 6A to 6C illustrate the birefringence distributions for lenses or lens parts of barium fluoride, whose lens axes are oriented in the crystallographic direction (100). Except for the different maximum values of the birefringence, the curves of FIGS. 6A, 6B are conjugate to the curves of FIGS. 5A, 5B. The fixed reference directions are set so that the minimum amounts of birefringence occur at the same azimuth angles in calcium fluoride as in barium fluoride. Comparing FIG. 5C to FIG. 6C, it becomes clear that on the one hand the distributions are conjugate to each other, and on the other hand the main directions of birefringence for the individual light-ray directions in calcium fluoride are orthogonal to the main directions of birefringence for the corresponding light-ray directions in barium fluoride.

The outermost aperture ray 15 in the first embodiment according to FIG. 1 has the same azimuth angle in the lenses 25 and 29 relative to the respective reference directions 25 and 29 (which are parallel to each other), because ray 15 intersects the image plane IM in the optical axis OA. The same also holds true for all other aperture rays that intersect the image plane IM in the optical axis OA. As the reference directions in the calcium fluoride lens 7 and in the barium fluoride lens 11 are selected in such a way that the birefringence distributions run conjugate to each other, this has the consequence that all aperture rays will be subject to a similar compensation of the optical path differences for two mutually orthogonal states of linear polarization. The birefringence distribution of lens 7 is shown in FIGS. 3A to 3C, and of lens 11 in FIGS. 4A to 4C. With an appropriate choice of the thicknesses of lenses 7 and 11, one can achieve a nearly total compensation at least for the outermost aperture rays.

Figure 7:
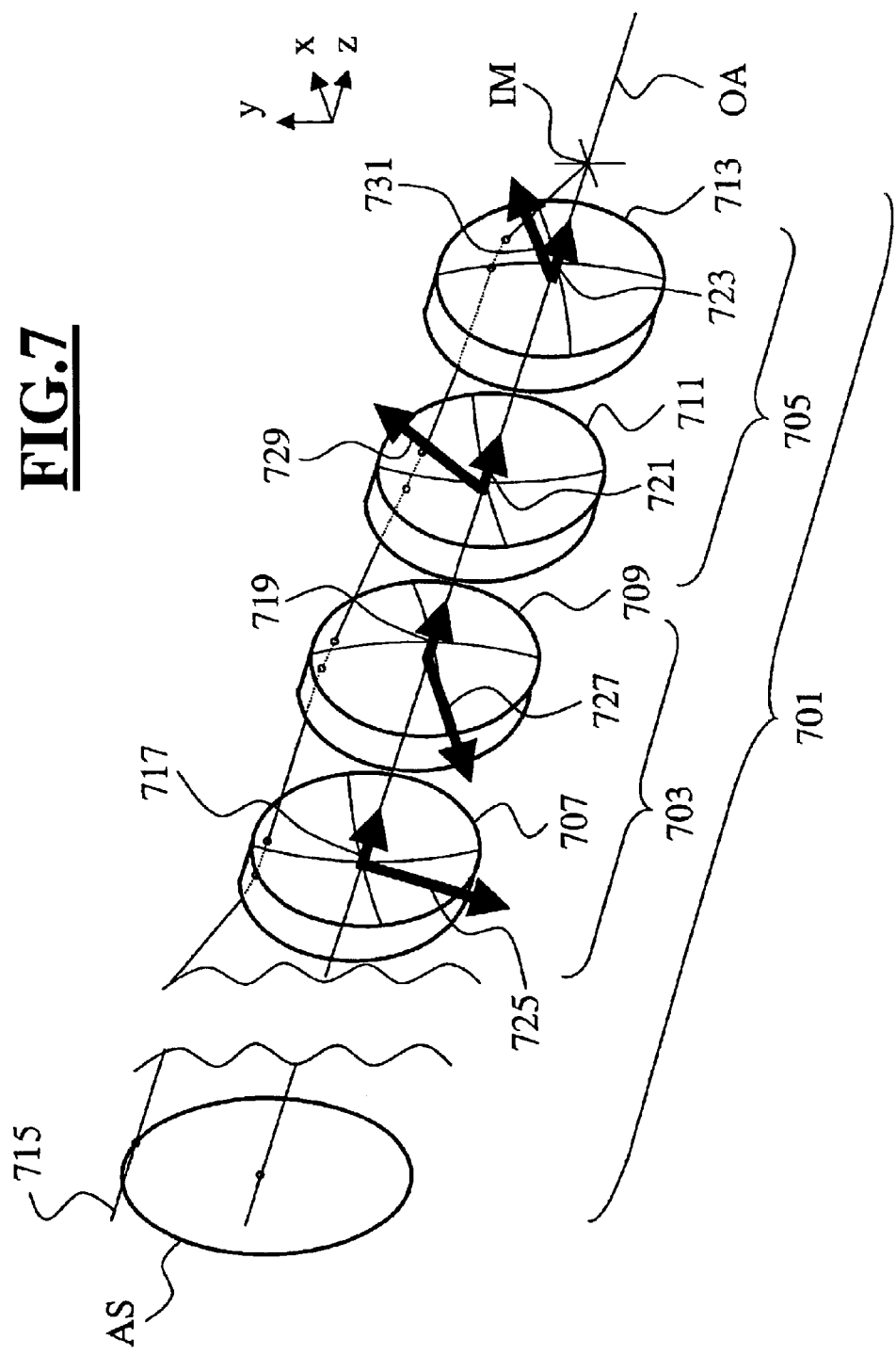
FIG. 7 represents a schematic view of a second embodiment.

FIG. 7 illustrates a second embodiment of an objective 701 according to the invention. The objective 701 has a first group 703 with the lenses 707 and 709, and a second group 705 with the lenses 711 and 713, in addition to further lenses that are not shown in the drawing. The lenses 707 and 709 consist of calcium fluoride crystal, while the lenses 711 and 713 consist of barium fluoride crystal. The lens axes, 717, 719, 721, and 723 are all aligned in the direction of the optical axis OA. The lenses 707 and 709 are made from a calcium fluoride block in such a manner that the lens axes 717 and 719 are aligned in the crystallographic direction <111>. Likewise in the lenses 711 and 713, which are made from a barium fluoride block, the lens axes 721 and 723 are aligned in the crystallographic direction <111>. In the lenses 707, 709, 711 and 713, the reference directions 725, 727, 729 and 731 are defined, which are fixed in relation to the respective lenses. Relative to the reference directions, the birefringence distributions of the lenses in group 705 are conjugate to those in group 703. The birefringence distribution for the lenses 707 and 709 can be seen in FIGS. 3A to 3C, and for the lenses 711 and 713 in FIGS. 4A to 4C. In the embodiment of FIG. 7, the reference direction 727 is rotated by 600 against the reference direction 725, and the reference direction 731 is likewise rotated by 60° against the reference direction 729. The angle of rotation between the groups 703 and 705 is a degree of freedom which can be used for the correction of image defects that are not rotationally symmetric. A further degree of freedom that can be used for corrective adjustments lies in the rotation of the two groups relative to a reference direction that is tied to the image plane. Due to the rotated arrangement of the lenses 707 and 709 in the group 703, a bundle of light rays that is focused at the intercept of the optical axis with the image plane will have approximate rotational symmetry in the distribution of the optical path differences for two mutually orthogonal states of linear polarization. The same bundle of light rays will also have approximate rotational symmetry in the distribution of the optical path differences on its passage through the two lenses 711 and 713 of group 705, as those lenses are likewise rotated relative to each other. However, the path differences in the distribution functions of group 703 and 705 have opposite signs because of the combined use of calcium fluoride and barium fluoride, so that the optical path differences at least partially compensate each other.

Figure 8A:
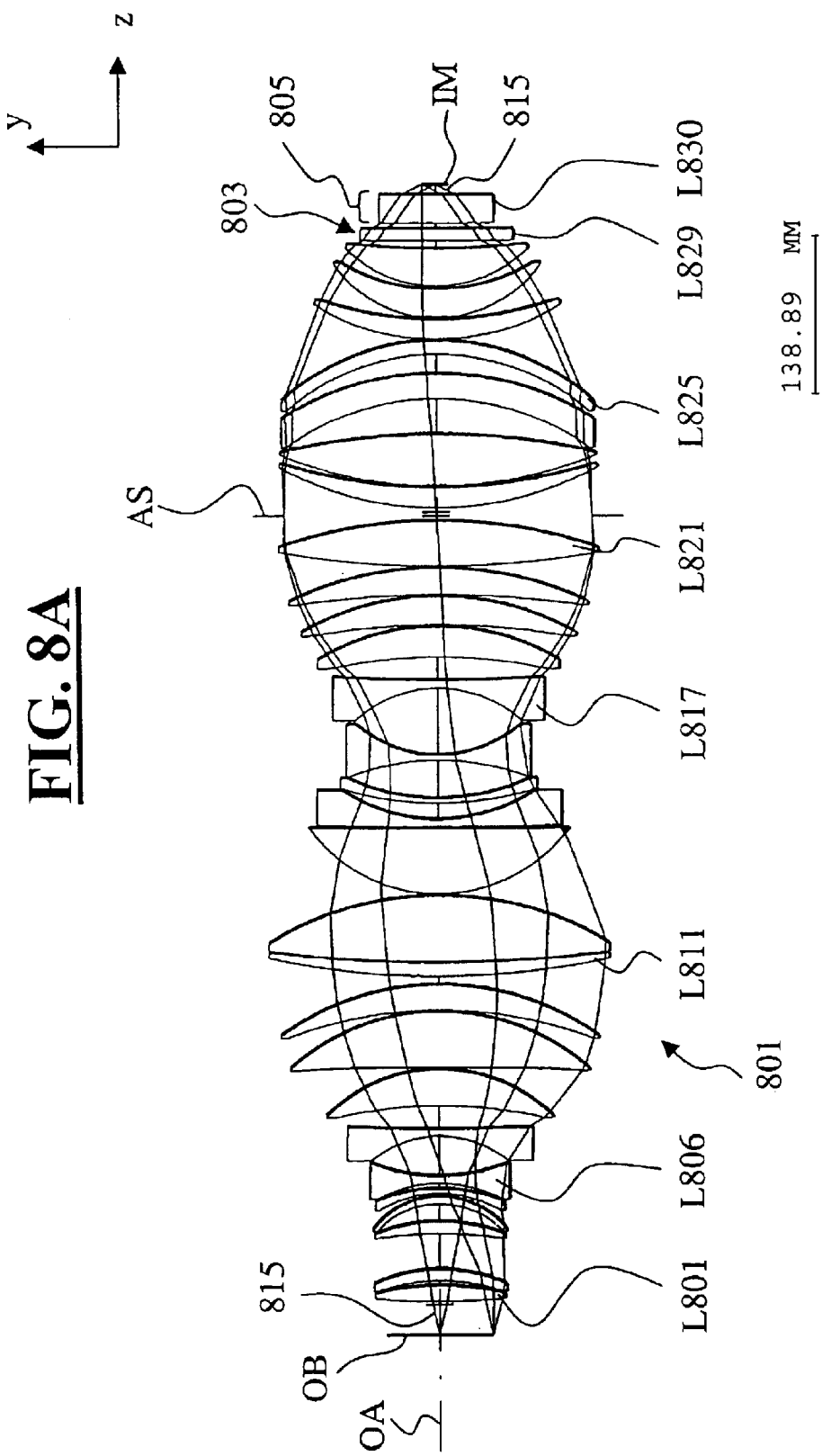
FIG. 8A represents a lengthwise section of a refractive projection objective according to the third and fourth embodiments of the invention.

FIG. 8A shows a third embodiment of an objective 801 in accordance with the invention. The objective 801 is a refractive projection objective designed for a wavelength of 157 nm. The optical data for this objective are listed in Table 1. The parameter data for the aspherical surface shapes are stated in accordance with the format of Optical Software Code V. The objective 801 is similar to an objective as described in FIG. 7 and Table 6 in patent application WO 150171 A1 of the applicant. For a more detailed description of the functional concepts involved in the objective 801 of the present invention, the reader is referred to that patent application. The numerical aperture on the image side of the objective is 0.9. Especially in high-performance objectives with such large numerical apertures on the image side, it is necessary to reduce detrimental influence factors such as birefringence as much as possible.

The objective 801 has a group 803 with the planar-parallel lens L829 and a group 805 with the planar-parallel lens L830. Lens L829 consists of barium fluoride, and lens L830 of calcium fluoride. The respective lens axes of the lenses L829 and L830 are oriented in the crystallographic direction <111>. The respective reference directions of the two lenses are both oriented in the y-direction. The birefringence distribution for the lens L829 can be found in FIGS. 4A to 4C, and the birefringence distribution for the lens L830 can be found in FIGS. 3A to 3C.

Table 2 lists the optical path lengths, the aperture angles $\theta_L$ and the azimuth angles $\alpha_L$ for two outermost aperture rays of the lenses L829 and L830. In the image plane, the light ray 815 has an azimuth angle of $\alpha_L = 0°$ in relation to the y-axis, and the light ray 816 (as referred to in Table 2, but not shown in FIG. 8A) has an azimuth angle of $\alpha_L = 60°$ in relation to the y-axis. Both rays intersect the image plane IM in the optical axis OA. The rays 815 and 816 are representative for all outermost aperture rays because they are subject, respectively, to the maximum and minimum amounts of birefringence with a crystallographic (111)-orientation.

thicknesses of the lenses L829 and L830 appropriately, so that the ratio of the respective optical path lengths in the two lenses is the reciprocal of the ratio of the birefringence values in the crystallographic direction <111> for barium fluoride and calcium fluoride, i.e., $$\frac{25 \text{ nm/cm}}{11 \text{ nm/cm}} \approx \frac{30.6 \text{ mm}}{13.4 \text{ mm}}.$$

The aperture angles of both lenses are larger than 30°. The lens L830 is the lens that is closest to the image plane IM.

A fourth embodiment of the invention (likewise represented by FIG. 8A) has the same design data as the third embodiment except that the respective lens axes of the lenses L829 and L830 are oriented in the crystallographic direction <100>. The reference directions of both lenses are aligned in the y-direction. The birefringence distribution for the lens L829 can be seen in FIGS. 6A to 6C, and for the lens 830 in FIGS. 5A to 5C.

Table 3 lists the optical path lengths, the aperture angles $\theta_L$ and the azimuth angles $\alpha_L$ for two outermost aperture rays of the lenses L829 and L830. In the image plane, the light ray 815 has an azimuth angle of $\alpha_L = 0°$ in relation to the y-axis, and the light ray 816 has an azimuth angle of $\alpha_L = 45°$ in relation to the y-axis. Both rays intersect the image plane IM in the optical axis OA. The rays 815 and 816 are representative for all outermost aperture rays because they are subject, respectively, to the maximum and minimum amounts of birefringence with a crystallographic (100)-orientation.

TABLE 2

| Lens | Aperture angle [°] | Path length [mm] | Material | Optical path difference for ray 815 [nm] | Optical path difference for ray 816 [nm] |
|---|---|---|---|---|---|
| L829 | 33.0 | 13.4 | (111)-BaF$_2$ | −33.40 | 7.31 |
| L830 | 35.2 | 30.6 | (111)-CaF$_2$ | 33.68 | −6.24 |
| Sum | | | | 0.27 | 1.06 |

The maximum value of the optical path difference for two mutually orthogonal states of linear polarization is significantly reduced in comparison to the individual optical path difference that either of the two lenses by itself contributes to the sum. In fact, the optical path differences compensate each other almost totally. This was achieved by selecting the

TABLE 3

| Lens | Aperture angle [°] | Path length [mm] | Material | Optical path difference for ray 815 [nm] | Optical path difference for ray 816 [nm] |
|---|---|---|---|---|---|
| L829 | 33.0 | 13.4 | (100)-BaF$_2$ | −28.07 | −11.07 |
| L830 | 35.2 | 30.6 | (100)-CaF$_2$ | 29.93 | 11.23 |
| Sum | | | | 1.85 | 0.16 |

In the fourth embodiment, likewise, an approximate compensation was achieved for the respective optical path differences occurring in the two groups 803 and 805.

A fifth embodiment of the invention (represented by FIG. 8B) has the same design data as the third embodiment except that lens L829 is split into the two lens parts L8291 and L8292, and the lens L830 is split into the lens parts L8301 and L8302. In both lenses, each of the lens parts has half the center thickness of the respective lens. The lens axes of all of the lens parts are oriented in the crystallographic direction <111>. The birefringence distribution for the lens parts L8291 and L8292 can be seen in FIGS. 4A to 4C, and for the lens parts 8301 and 8302 in FIGS. 3A to 3C. The lens parts L8291 and L8292 are rotated relative to each other by 60° about the lens axis and are joined seamlessly, e.g., with a wringing fit. In like manner, the lens parts 8301 and 8302 are rotated relative to each other by 60° about the lens axis and seamlessly joined together. The reference directions of the lens parts L8291 and L8301 are oriented in the y-direction, while the reference direction of the lens parts L8292 and L8302 enclose an angle of 60° with the y-axis.

Table 4 lists the optical path lengths, the aperture angles $\theta_L$ and the azimuth angles $\alpha_L$ for two outermost aperture rays of the lens parts L8291, L8292, L8301, and L8302. In the image plane, the light ray 815 has an azimuth angle of $\alpha_L=0°$ in relation to the y-axis, and the light ray 816 has an azimuth angle of $\alpha_L=60°$ in relation to the y-axis. Both rays intersect the image plane IM in the optical axis OA. The rays 815 and 816 are representative for all outermost aperture rays because they are subject, respectively, to the maximum and minimum amounts of birefringence with a crystallographic (111)-orientation.

A sixth embodiment of the invention (likewise represented by FIG. 8B) has the same design data as the fifth embodiment except that the respective lens axes of the lens parts L8291, L8292, L8301 and L8302 are oriented in the crystallographic direction <100>. The birefringence distribution for the lens parts L8291 and L8292 can be seen in FIGS. 6A to 6C, and for the lens parts L8301 and L8302 in FIGS. 5A to 5C. The lens parts L8291 and L8292 are rotated relative to each other by 45° about the lens axis and are joined seamlessly, e.g., with a wringing fit. In like manner, the lens parts 8301 and 8302 are rotated relative to each other by 45° about the lens axis and seamlessly joined together. The reference directions of the lens parts L8291 and L8301 are oriented in the y-direction, while the reference direction of the lens parts L8292 and L8302 enclose an angle of 45° with the y-axis.

Table 5 lists the optical path lengths, the aperture angles $\theta_L$ and the azimuth angles $\alpha_L$ for two outermost aperture rays of the lens parts L8291, L8292, L8301, and L8302. In the image plane, the light ray 815 has an azimuth angle of $\alpha_L=0°$ in relation to the y-axis, and the light ray 816 has an azimuth angle of $\alpha_L=45°$ in relation to the y-axis. Both rays intersect the image plane IM in the optical axis OA. The rays 815 and 816 are representative for all outermost aperture rays because they are subject, respectively, to the maximum and minimum amounts of birefringence with a crystallographic (100)-orientation.

TABLE 4

| Lens part | Aperture angle [°] | Path length [mm] | Material | Optical path difference for ray 815 [nm] | Optical path difference for ray 816 [nm] |
|---|---|---|---|---|---|
| L8291 | 33.0 | 6.7 | (111)-BaF$_2$ | −16.70 | 3.65 |
| L8292 | 33.0 | 6.7 | (111)-BaF$_2$ | 3.65 | −16.70 |
| L8301 | 35.2 | 15.3 | (111)-CaF$_2$ | 16.84 | −3.12 |
| L8302 | 35.2 | 15.3 | (111)-CaF$_2$ | −3.12 | 16.84 |
| Sum | | | | 0.67 | 0.67 |

In the fifth embodiment, likewise, an approximate compensation was achieved for the respective optical path differences occurring in the two groups 803 and 805. Characteristic for this embodiment, both of the groups 803 and 805 exhibit a rotationally symmetric distribution of the optical path differences for a bundle of rays that is focused on the intercept point of the optical axis and the image plane. The two distribution functions compensate each other due to the parallel use of barium fluoride and calcium fluoride in combination with the specifically selected optical design of the lens parts of the two groups.

TABLE 5

| Lens part | Aperture angle [°] | Path length [mm] | Material | Optical path difference for ray 815 [nm] | Optical path difference for ray 816 [nm] |
|---|---|---|---|---|---|
| L8291 | 33.0 | 6.7 | (100)-BaF$_2$ | −14.04 | −5.54 |
| L8292 | 33.0 | 6.7 | (100)-BaF$_2$ | −5.54 | −14.04 |
| L8301 | 35.2 | 15.3 | (100)-CaF$_2$ | 14.96 | 5.61 |
| L8302 | 35.2 | 15.3 | (100)-CaF$_2$ | 5.61 | 14.96 |
| Sum | | | | 1.00 | 1.00 |

In the sixth embodiment, likewise, an approximate compensation was achieved for the respective optical path differences occurring in the two groups 803 and 805. Characteristic for this embodiment, both of the groups 803 and 805 exhibit a rotationally symmetric distribution of the optical path differences for a bundle of rays that is focused on the intercept point of the optical axis and the image plane.

The two distribution functions compensate each other due to the parallel use of barium fluoride and calcium fluoride in combination with the specifically selected optical design of the lens parts of the two groups.

Figure 9:
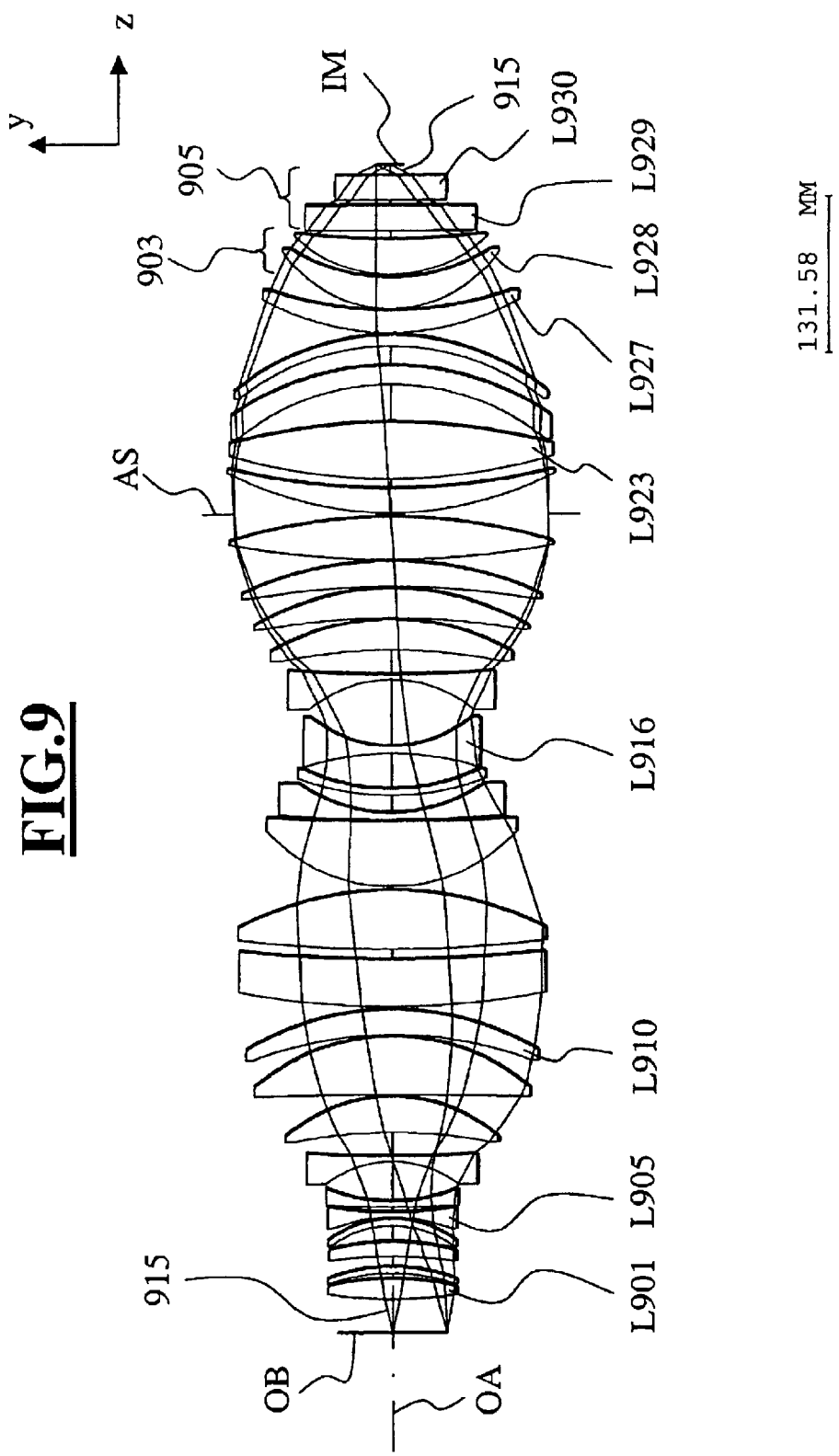
FIG. 9 represents a lengthwise section of a refractive projection objective according to the seventh to tenth embodiments of the invention.

FIG. 9 shows a seventh embodiment of an objective 901 in accordance with the invention. The objective 901 is a 20 refractive projection objective designed for a wavelength of 157 nm. The optical data for this objective are listed in Table 6. The parameter data for the aspherical surface shapes are stated in accordance with the format of Optical Software Code V. The numerical aperture on the image side of the objective is 0.9.

The objective 901 has a group 903 with meniscus-shaped lenses L927 and L928, and a group 905 with planar-parallel lenses L929 and L930. The lenses L927 and L928 consist of barium fluoride, the lenses L929 and L930 of calcium fluoride. The respective lens axes of the lenses L927, L928, L929 and L930 are oriented in the crystallographic direction <111>. The reference directions of the lenses are all oriented the same way, i.e., in the y-direction in the illustrated example. The birefringence distribution for the lenses L927 and L928 can be found in FIGS. 4A to 4C, and the birefringence distribution for the lens L929 and L930 can be found in FIGS. 3A to 3C.

Table 7 lists the optical path lengths, the aperture angles $\theta_L$ and the azimuth angles $\alpha_L$ for two outermost aperture rays of the lenses L927 to L930. In the image plane, the light ray 915 has an azimuth angle of $\alpha_L=0°$ in relation to the y-axis, and the light ray 916 has an azimuth angle of $\alpha_L=60°$ in relation to the y-axis. Both rays intersect the image plane IM in the optical axis OA. The rays 915 and 916 are representative for all outermost aperture rays because they are subject, respectively, to the maximum and minimum amounts of birefringence with a crystallographic (111)-orientation.

$$\frac{25 \text{ nm/cm}}{11 \text{ nm/cm}} \approx \frac{27.3 \text{ mm} + 26.0 \text{ mm}}{11.1 \text{ mm} + 11.6 \text{ mm}}.$$

The cross-sectional representation of FIG. 9 makes it clear that in the meniscus-shaped lenses L927 and L928, the optical path lengths of aperture rays increase with narrower aperture angles, while in the planar-parallel lenses L929 and L930, the optical path lengths of aperture rays decrease with narrower aperture angles. Thus, the condition stated above is met primarily for the outermost aperture rays. However, it should be kept in mind that the magnitude of the birefringence values, too, decreases strongly with narrower aperture angles, so that compensation is not necessary at small aperture angles. This thought may be applied to an alternative solution in which the thickness profiles of the lenses are selected in such a manner that the birefringence for a bundle of light rays is minimized overall rather than for only the outermost aperture rays.

An eighth embodiment of the invention has the same design data as the seventh embodiment except that the respective lens axes of the lenses L927 to L930 are oriented in the crystallographic direction <100>. The reference directions of the lenses L927 to L930 are oriented in the y-direction. The birefringence distribution for the lenses L927 and L928 can be seen in FIGS. 6A to 6C, and for the lenses L929 and L930 in FIGS. 5A to 5C.

Table 8 lists the optical path lengths, the aperture angles $\theta_L$ and the azimuth angles $\alpha_L$ for two outermost aperture rays of the lenses L927 to L930. In the image plane, the light ray 915 has an azimuth angle of $\alpha_L=0°$ in relation to the y-axis, and the light ray 916 has an azimuth angle of $\alpha_L=45°$ in relation to the y-axis. Both rays intersect the image plane IM in the optical axis OA. The rays 915 and 916 are representative for all outermost aperture rays because they are subject, respectively, to the maximum and minimum amounts of birefringence with a crystallographic (100)-orientation.

TABLE 7

| Lens | Aperture angle [°] | Path length [mm] | Material | Optical path difference for ray 815 [nm] | Optical path difference for ray 816 [nm] |
|---|---|---|---|---|---|
| L927 | 34.7 | 11.1 | (111)-BaF$_2$ | −27.73 | 5.37 |
| L928 | 37.7 | 11.6 | (111)-BaF$_2$ | −28.79 | 4.33 |
| 1929 | 35.3 | 27.3 | (111)-CaF$_2$ | 29.99 | −5.56 |
| L930 | 35.3 | 26.0 | (111)-CaF$_2$ | 28.59 | −5.30 |
| Sum | | | | 2.05 | −1.16 |

For the outermost aperture rays, the maximum value of the optical path difference for two mutually orthogonal states of linear polarization is significantly reduced in comparison to the individual optical path differences that each of the lenses by itself contributes to the sum. In fact, the optical path differences in the two groups 903 and 905 compensate each other almost totally. This was achieved by selecting the thicknesses of the lenses L829 and L830 appropriately, so that the ratio of the respective optical path lengths in the two lenses is the reciprocal of the ratio of the birefringence values in the crystallographic direction <110> for barium fluoride and calcium fluoride, i.e.,

TABLE 8

| Lens | Aperture angle [°] | Path length [mm] | Material | Optical path difference for ray 815 [nm] | Optical path difference for ray 816 [nm] |
|---|---|---|---|---|---|
| L927 | 34.7 | 11.1 | (111)-BaF$_2$ | −24.31 | −9.24 |
| L928 | 37.7 | 11.6 | (111)-BaF$_2$ | −27.17 | −9.52 |
| L929 | 35.3 | 27.3 | (111)-CaF$_2$ | 26.65 | 10.00 |
| L930 | 35.3 | 26.0 | (111)-CaF$_2$ | 25.41 | 9.53 |
| Sum | | | | 0.58 | 0.76 |

In the eighth embodiment, likewise, an approximate compensation was achieved for the respective optical path differences occurring in the two groups 903 and 905.

A ninth embodiment of the invention has the same design data as the seventh embodiment except that the lenses L927 and L928 are rotated relative to each other by 60° about the lens axes, as are the lenses L929 and L930. The reference directions of the lenses L927 and L929 are oriented in the y-direction, while the reference directions of the lenses L928 and L930 enclose an angle of 60° with the y-direction.

Table 9 lists the optical path lengths, the aperture angles $\theta_L$ and the azimuth angles $\alpha_L$ for two outermost aperture rays of the lenses L927 to L930. In the image plane, the light ray 915 has an azimuth angle of $\alpha_L=0°$ in relation to the y-axis, and the light ray 916 has an azimuth angle of $\alpha_L=60°$ in relation to the y-axis. Both rays intersect the image plane IM in the optical axis OA. The rays 915 and 916 are representative for all outermost aperture rays because they are subject, respectively, to the maximum and minimum amounts of birefringence with a crystallographic (111)-orientation.

5C. The lenses L927 and L928 are rotated relative to each other by 450 about the lens axis. In like manner, the lenses L929 and L930 are rotated relative to each other by 45° about the lens axis. The reference directions of the lenses L927 and L929 are oriented in the y-direction, while the reference direction of the lenses L928 and L930 enclose an angle of 45° with the y-axis.

Table 10 lists the optical path lengths, the aperture angles $\theta_L$ and the azimuth angles $\alpha_L$ for two outermost aperture rays of the lenses L927 to L930. In the image plane, the light ray 915 has an azimuth angle of $\alpha_L=0°$ in relation to the y-axis, and the light ray 916 has an azimuth angle of $\alpha_L=45°$ in relation to the y-axis. Both rays intersect the image plane IM in the optical axis OA. The rays 915 and 916 are representative for all outermost aperture rays because they are subject, respectively, to the maximum and minimum amounts of birefringence with a crystallographic (100)-orientation.

TABLE 9

| Lens | Aperture angle [°] | Path length [mm] | Material | Optical path difference for ray 815 [nm] | Optical path difference for ray 816 [nm] |
|---|---|---|---|---|---|
| L927 | 34.7 | 11.1 | (111)-BaF$_2$ | −27.73 | 4.33 |
| L928 | 37.7 | 11.6 | (111)-BaF$_2$ | 4.33 | −27.73 |
| L929 | 35.3 | 27.3 | (111)-CaF$_2$ | 29.99 | −5.30 |
| L930 | 35.3 | 26.0 | (111)-CaF$_2$ | −5.30 | 29.99 |
| Sum | | | | 1.28 | 1.28 |

In the ninth embodiment, likewise, an approximate compensation was achieved for the respective optical path differences occurring in the two groups 903 and 905. Characteristic for this embodiment, both of the groups 903 and 905 exhibit a rotationally symmetric distribution of the optical path differences for a bundle of rays that is focused on the intercept point of the optical axis and the image plane. The two distribution functions compensate each other due to the parallel use of barium fluoride and calcium fluoride in combination with the specifically selected optical design of the lens parts of the two groups.

A tenth embodiment of the invention has the same design data as the eighth embodiment except that the respective lens axes of the lenses L927 to L930 are oriented in the crystallographic direction <100>. The birefringence distribution for the lenses L927 and L928 can be seen in FIGS. 6A to 6C, and for the lenses L929 and L930 in FIGS. 5A to

TABLE 10

| Lens | Aperture angle [°] | Path length [mm] | Material | Optical path difference for ray 815 [nm] | Optical path difference for ray 816 [nm] |
|---|---|---|---|---|---|
| L927 | 34.7 | 11.1 | (100)-BaF$_2$ | −24.31 | −9.52 |
| L928 | 37.7 | 11.6 | (100)-BaF$_2$ | −9.52 | −24.31 |
| L929 | 35.3 | 27.3 | (100)-CaF$_2$ | 26.65 | 9.53 |
| L930 | 35.3 | 26.0 | (100)-CaF$_2$ | 9.53 | 26.65 |
| Sum | | | | 2.35 | 2.35 |

In the tenth embodiment, likewise, an approximate compensation was achieved for the respective optical path differences occurring in the two groups 903 and 905. Characteristic for this embodiment, both of the groups 903 and 905 exhibit a rotationally symmetric distribution of the optical path differences for a bundle of rays that is focused on the intercept point of the optical axis and the image plane. The two distribution functions compensate each other due to the parallel use of barium fluoride and calcium fluoride in combination with the specifically selected optical design of the lens parts of the two groups.

Figure 10:
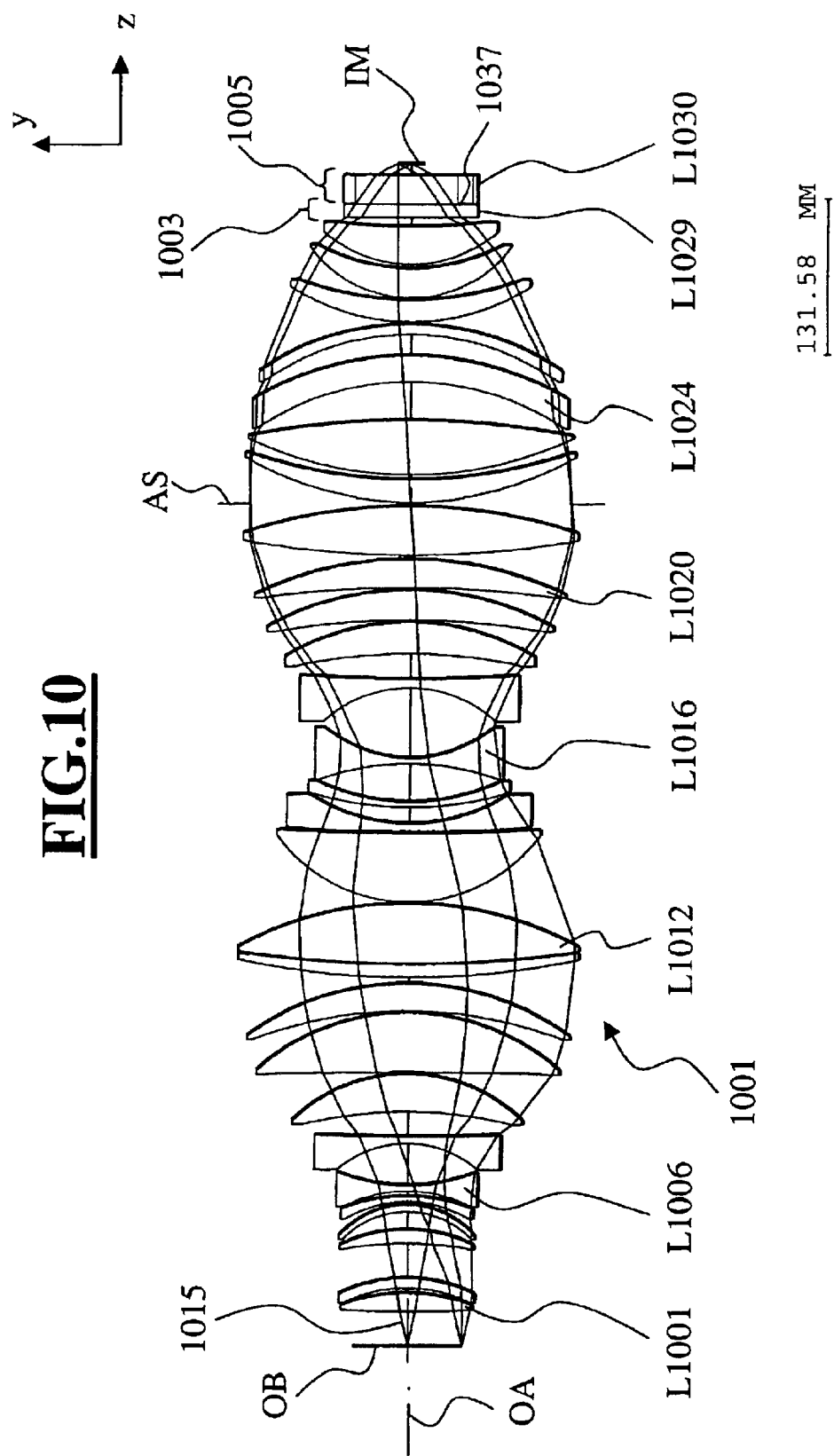
FIG. 10 represents a lengthwise section of a refractive projection objective according to the eleventh embodiment of the invention.

FIG. 10 shows an eleventh embodiment of an objective 1001 in accordance with the invention. The objective 1001 is a refractive projection objective designed for a wavelength of 157 nm. The optical data for this objective are listed in Table 11. The parameter data for the aspherical surface shapes are stated in accordance with the format of Optical Software Code V. The numerical aperture on the image side of the objective is 0.9.

The objective 1001 has a group 1003 with a planar-parallel lens part L1029, and a group 1005 with a planar-parallel lens part L1030. The lens part L1029 consists of barium fluoride, while the lens part L1030 consists of calcium fluoride. The respective lens axes of the lens parts L1029 and L1030 are oriented in the crystallographic direction <111>. In an alternative embodiment, the lens axes could also be oriented in the crystallographic direction <100>. The reference directions of the lenses are oriented the same way, i.e., in the y-direction in the illustrated example. The lens parts L1029 and L1030 are joined seamlessly, e.g., with a wringing fit. The thicknesses of the lens parts in the foregoing embodiment are selected appropriately, so that the optical path differences that occur in an outermost aperture ray in the two lens parts will approximately compensate each other. To achieve this condition, the ratio of the thickness of the two lens parts is selected as the reciprocal of the ratio of the birefringence values in the crystallographic direction <110> for barium fluoride and calcium fluoride, i.e., $$\frac{25 \text{ nm/cm}}{11 \text{ nm/cm}} \approx \frac{25.0 \text{ mm}}{11.27 \text{ mm}}.$$

The small discrepancy is due to the fact that the difference in the refractive indices of the crystal materials has been taken into account.

As described in some of the examples of embodiments, the effects of birefringence in crystals in the ultraviolet range can be compensated with a serial arrangement of crystal elements whose birefringent properties are complementary to each other. With a serial arrangement of lenses in an optical system, one encounters the problem that in many cases the light rays traverse the lenses at different angles, which may limit the extent to which compensation is possible. The compensation by a serial arrangement of lenses is obviously impossible in optical systems in which only one lens consists of a crystalline material.

As one possible solution, a lens can be made as a so-called split lens with two lens parts consisting of different crystalline materials, where the two lens parts are joined together by a wringing fit. It is proposed to manufacture the lens blanks by wringing together plates of different crystalline materials with complementary birefringent properties, for example calcium fluoride and barium fluoride, and subsequently produce the lenses from the blanks by the conventional processes of grinding and polishing. Everything said above with regard to the alignment of the lens axes and the reference directions also applies to these split lenses.

In addition to the classical technique of wringing in the optical manufacturing process, the lenses can also be joined by any other joining technique that provides intimate contact and introduces the least possible amount of stress, and the use of such techniques is considered to be within the realm of the present invention. The wringing can be helped in particular by layers of, e.g., quartz glass. It is important to avoid the occurrence of refraction or reflection at the joining interface, because this would impair the optical quality of the split lens. The lens 1037 with the lens parts L1029 and L1030 in the eleventh embodiment shown in FIG. 10 represents a split lens made by one of the aforementioned joining techniques.

Of course, the number of plates that can be seamlessly joined is not limited to two plates; it is likewise possible to seamlessly join 4, 6, 8, 10 . . . plates, alternating between barium fluoride and calcium fluoride. In such an arrangement, the lens axes in each pair of plates with different crystalline materials are aligned in the same principal crystallographic direction, e.g., the direction (100) or (111). Equivalent principal crystallographic directions should likewise be oriented in approximately equal directions.

It should be self-evident that the technique for compensating the effects of birefringence as proposed by the present invention can also be applied in a catadioptric objective, if the objective includes lenses made of crystalline materials with an intrinsic birefringence that causes optical path differences between two mutually orthogonal states of linear polarization in light rays traversing the crystalline lenses.

Figure 11:
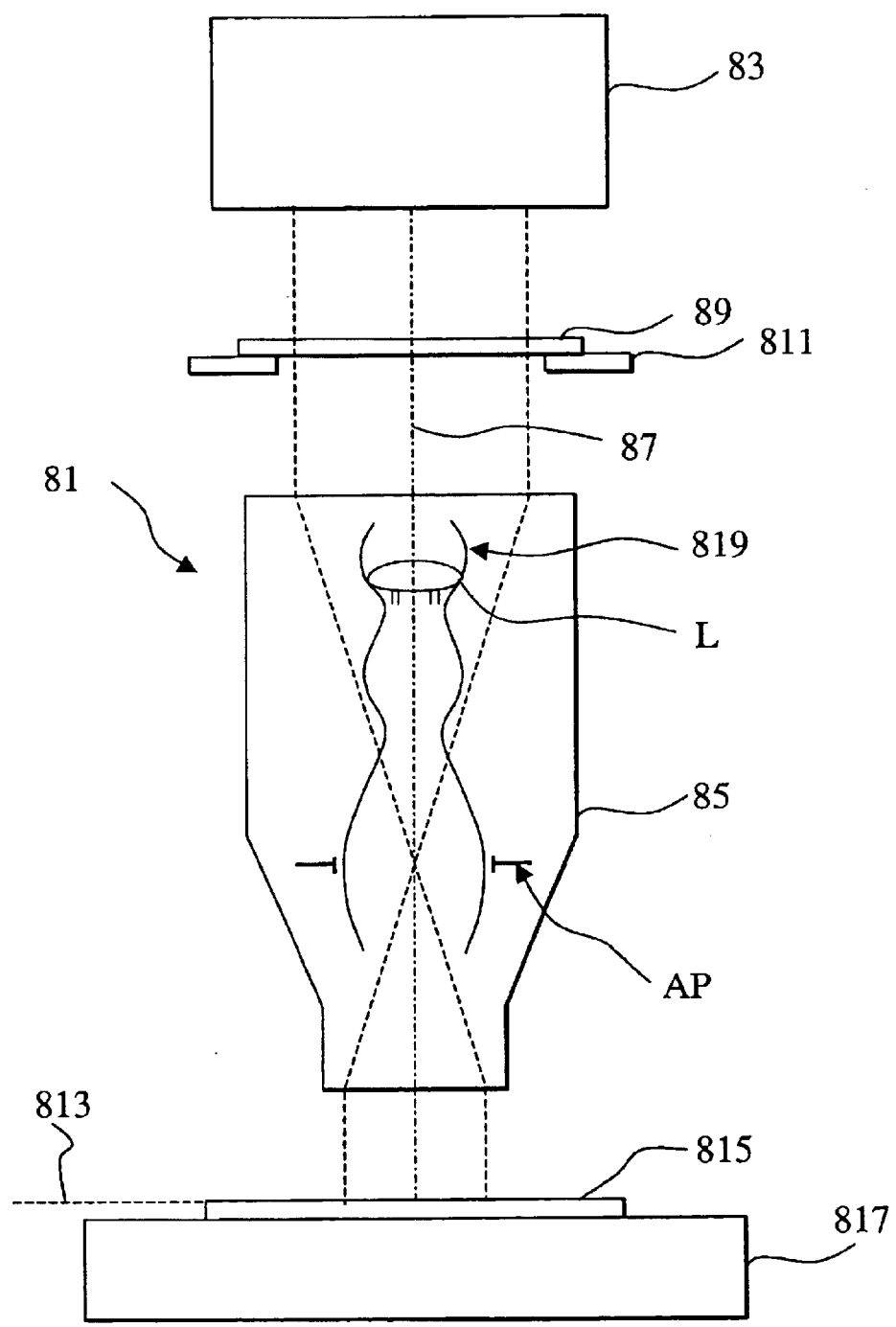
FIG. 11 represents a microlithography projection system in a schematic view.

FIG. 11 illustrates the principal arrangement of a microlithography projection apparatus. The projection apparatus 81 has an illumination system 83 and a projection objective 85. The projection objective 85 includes a lens arrangement 819 with an aperture diaphragm AP. The lens arrangement 819, which is exemplified by the embodiments of FIGS. 8 to 10, defines an optical axis 87. Arranged between the illumination system 83 and the projection objective 85 is a mask 89 which is positioned in the light path by means of a mask holder 811. A mask 89 of the kind that is used in microlithography has a structure with detail dimensions in the range of micrometers and nanometers, which is projected by means of the projection objective 85 onto an image plane 813 with a reduction factor of e.g., 4 or 5. A light-sensitive substrate 815, normally a wafer, is held in position in the image plane by a substrate holder 817.

The minimum size of the structural details that can be resolved in the projection depends on the wavelength λ of the light used for illumination, and also on the numerical aperture on the image side of the projection objective 85. With the embodiments shown in FIGS. 8 to 10 and the variant versions described hereinabove, it is possible to realize resolution levels finer than 150 nm. Because of the fine resolution desired, it is necessary to minimize effects such as intrinsic birefringence. The present invention represents a successful solution to strongly reduce the detrimental influence of intrinsic birefringence particularly in projection objectives with a large numerical aperture on the image side.

TABLE 1

| LENS | SURFACE | RADIUS [mm] | ASPHERES | THICKNESS [mm] | MATERIAL | REFRACTIVE INDEX | DIAMETER [mm] |
|---|---|---|---|---|---|---|---|
| OB | 0 | | | 27.171 | | | |
| | 1 | 0.000 | | 1.597 | | | 104.9 |
| L801 | 2 | 863.838 | A | 15.320 | CAF2 | 1.55929 | 107.0 |
| | 3 | −200.656 | | 3.508 | | | 107.9 |
| L802 | 4 | −147.739 | | 10.274 | CAF2 | 1.55929 | 107.8 |
| | 5 | −148.346 | | 30.167 | | | 110.3 |
| L803 | 6 | −473.818 | | 11.506 | CAF2 | 1.55929 | 108.4 |
| | 7 | −158.219 | | 14.675 | | | 108.6 |
| L804 | 8 | −75.280 | | 7.140 | CAF2 | 1.55929 | 108.1 |
| | 9 | −71.424 | A | 1.528 | | | 110.7 |
| L805 | 10 | −89.621 | A | 5.004 | CAF2 | 1.55929 | 106.1 |
| | 11 | −141.618 | | 3.888 | | | 107.7 |
| L806 | 12 | −111.583 | | 6.478 | CAF2 | 1.55929 | 107.6 |
| | 13 | 158.108 | | 35.049 | | | 115.9 |
| L807 | 14 | −91.236 | | 6.345 | CAF2 | 1.55929 | 118.3 |
| | 15 | −190475.535 | A | 20.293 | | | 155.7 |
| L808 | 16 | −391.134 | | 32.097 | CAF2 | 1.55929 | 181.4 |
| | 17 | −140.566 | | 0.701 | | | 190.6 |
| L809 | 18 | −4014.286 | A | 50.580 | CAF2 | 1.55929 | 246.6 |
| | 19 | −195.308 | | 0.700 | | | 252.9 |
| L810 | 20 | −380.954 | | 23.124 | CAF2 | 1.55929 | 266.9 |
| | 21 | −237.201 | | 6.590 | | | 270.2 |
| L811 | 22 | 673.497 | | 18.602 | CAF2 | 1.55929 | 289.4 |
| | 23 | 1339.738 | | 0.912 | | | 289.7 |
| L812 | 24 | 1293.594 | | 59.972 | CAF2 | 1.55929 | 289.9 |
| | 25 | −284.227 | | 0.967 | | | 290.1 |
| L813 | 26 | 138.501 | | 59.142 | CAF2 | 1.55929 | 219.4 |
| | 27 | −3400.118 | A | 0.700 | | | 212.3 |
| L814 | 28 | 3372.064 | | 6.948 | CAF2 | 1.55929 | 206.8 |
| | 29 | 148.844 | | 13.848 | | | 167.0 |
| L815 | 30 | 282.076 | | 5.000 | CAF2 | 1.55929 | 166.1 |
| | 31 | 186.540 | | 32.462 | | | 156.5 |
| L816 | 32 | −222.337 | | 5.000 | CAF2 | 1.55929 | 155.1 |
| | 33 | 101.316 | A | 58.400 | | | 142.3 |
| L817 | 34 | −106.860 | | 7.678 | CAF2 | 1.55929 | 144.0 |
| | 35 | 1468.081 | | 20.283 | | | 178.7 |
| L818 | 36 | −438.496 | | 27.364 | CAF2 | 1.55929 | 191.7 |
| | 37 | −205.587 | | 0.740 | | | 204.9 |
| L819 | 38 | −665.101 | | 26.016 | CAF2 | 1.55929 | 228.2 |
| | 39 | −239.671 | | 0.751 | | | 233.3 |
| L820 | 40 | −863.669 | | 23.903 | CAF2 | 1.55929 | 250.5 |
| | 41 | −305.007 | | 1.116 | | | 253.8 |
| L821 | 42 | 759.602 | | 40.337 | CAF2 | 1.55929 | 271.7 |
| | 43 | −430.706 | | 2.124 | | | 272.6 |
| | 44 | 0.000 | | 2.126 | | | 268.8 |
| | 45 | 0.000 | | 4.010 | | | 268.5 |
| AS | | 0.000 | | 0.000 | | | 268.5 |
| | 46 | 0.000 | | 4.078 | | | 268.7 |
| L822 | 47 | 294.311 | A | 17.747 | CAF2 | 1.55929 | 271.3 |
| | 48 | 450.071 | | 0.700 | | | 269.7 |
| L823 | 49 | 354.260 | | 45.709 | CAF2 | 1.55929 | 268.6 |
| | 50 | −628.981 | | 31.273 | | | 266.7 |
| L824 | 51 | −223.945 | | 22.682 | CAF2 | 1.55929 | 264.3 |
| | 52 | −252.861 | A | 16.632 | | | 266.0 |
| L825 | 53 | −199.390 | A | 11.790 | CAF2 | 1.55929 | 261.7 |
| | 54 | −203.770 | | 0.739 | | | 264.4 |
| L826 | 55 | 202.940 | | 18.203 | CAF2 | 1.55929 | 207.8 |
| | 56 | 319.660 | | 0.720 | | | 202.5 |
| L827 | 57 | 109.514 | | 25.591 | CAF2 | 1.55929 | 174.5 |
| | 58 | 165.046 | | 2.390 | | | 167.1 |
| L828 | 59 | 114.348 | | 32.199 | CAF2 | 1.55929 | 152.4 |
| | 60 | 833.310 | A | 6.970 | | | 140.2 |
| L829 | 61 | 0.000 | | 11.270 | BAF2 | 1.656711 | 127.8 |
| | 62 | 0.000 | | 4.281 | | | 113.1 |
| L830 | 63 | 0.000 | | 25.000 | CAF2 | 1.55929 | 94.9 |
| | 64 | 0.000 | | 8.491 | | | 59.3 |
| IM | | | | | | | |

TABLE 1-continued

|  | ASPHERICAL CONSTANTS ON SURFACE 2 | ASPHERICAL CONSTANTS ON SURFACE 9 | ASPHERICAL CONSTANTS ON SURFACE 10 |
|---|---|---|---|
| K | 0.00000000E+00 | 1.33118380E+00 | 1.14173310E+00 |
| C1 | 1.43406980E−07 | −3.97151580E−07 | 1.07675330E−07 |
| C2 | 3.66764560E−12 | 2.13301910E−11 | 8.11726760E−12 |
| C3 | −6.40170580E−16 | −2.22298210E−14 | −1.74544180E−14 |
| C4 | 4.82608710E−19 | 4.27334510E−18 | 3.60324490E−18 |
| C5 | −1.54221580E−22 | −7.26436720E−22 | −5.48788020E−22 |
| C6 | 2.03643500E−26 | 8.93486070E−26 | −1.48455920E−27 |
| C7 | −1.81296840E−30 | −8.26574910E−30 | 1.65862760E−29 |

|  | ASPHERICAL CONSTANTS ON SURFACE 15 | ASPHERICAL CONSTANTS ON SURFACE 18 | ASPHERICAL CONSTANTS ON SURFACE 27 |
|---|---|---|---|
| K | 0.00000000E+00 | 0.00000000E+00 | 0.00000000E+00 |
| C1 | 1.34690690E−07 | 6.84191460E−09 | 2.25079630E−08 |
| C2 | −2.20196820E−11 | −4.93012980E−13 | −4.37381470E−13 |
| C3 | 1.15811890E−15 | −7.41221300E−17 | −3.95216400E−17 |
| C4 | 3.82004910E−20 | −4.49958980E−22 | 4.54656670E−21 |
| C5 | −2.33683250E−23 | 3.44810850E−26 | −3.38353680E−25 |
| C6 | 3.03364640E−27 | 1.41261060E−31 | 1.24134620E−29 |
| C7 | −1.38465170E−31 | −3.33619650E−35 | −7.65905610E−35 |

|  | ASPHERICAL CONSTANTS ON SURFACE 33 | ASPHERICAL CONSTANTS ON SURFACE 47 | ASPHERICAL CONSTANTS ON SURFACE 52 |
|---|---|---|---|
| K | 0.00000000E+00 | −4.21301580E−02 | 0.00000000E+00 |
| C1 | −2.72572600E−08 | 6.97070540E−10 | 3.16678050E−10 |
| C2 | −1.07149080E−11 | −1.91474390E−14 | −2.38262840E−14 |
| C3 | −2.27575940E−16 | 5.67039810E−21 | −8.79848330E−19 |
| C4 | −3.48098360E−20 | 3.14322250E−24 | 1.40449620E−22 |
| C5 | −5.57626390E−24 | 1.82125770E−27 | −8.40675220E−27 |
| C6 | 1.39652200E−27 | −7.08882090E−32 | 2.53973400E−31 |
| C7 | −1.62805240E−31 | 2.50287590E−36 | −5.45983220E−36 |

|  | ASPHERICAL CONSTANTS ON SURFACE 53 | ASPHERICAL CONSTANTS ON SURFACE 60 |
|---|---|---|
| K | 0.00000000E+00 | 0.00000000E+00 |
| C1 | −4.09943960E−10 | 4.49544780E−08 |
| C2 | 5.89403550E−14 | 1.97279190E−12 |
| C3 | 4.15502030E−18 | −6.05621650E−16 |
| C4 | −2.50452750E−23 | 6.66917110E−20 |
| C5 | −7.00090630E−27 | −3.16256020E−24 |
| C6 | 1.46249150E−31 | −2.37926370E−28 |
| C7 | −1.15248250E−36 | 3.29200600E−32 |

TABLE 6

| LENS | SURFACE | RADIUS [mm] | ASPHERES | THICKNESS [mm] | MATERIAL | REFRACTIVE INDEX | DIAMETER [mm] |
|---|---|---|---|---|---|---|---|
| OB | 0 |  |  | 27.171 |  |  |  |
|  | 1 | 0.000 |  | 0.603 |  |  | 101.8 |
| L901 | 2 | 597.962 | A | 17.208 | CAF2 | 1.55929 | 103.2 |
|  | 3 | −241.022 |  | 3.988 |  |  | 104.0 |
| L902 | 4 | −162.701 |  | 6.063 | CAF2 | 1.55929 | 103.8 |
|  | 5 | −150.220 |  | 8.329 |  |  | 104.7 |
| L903 | 6 | −407.493 |  | 12.463 | CAF2 | 1.55929 | 102.7 |
|  | 7 | −224.216 |  | 13.041 |  |  | 102.8 |
| L904 | 8 | −86.476 |  | 6.562 | CAF2 | 1.55929 | 102.1 |
|  | 9 | −83.937 | A | 0.700 |  |  | 104.3 |
| L905 | 10 | −120.295 | A | 5.232 | CAF2 | 1.55929 | 102.5 |
|  | 11 | 374.106 |  | 3.361 |  |  | 104.6 |
| L906 | 12 | 1032.465 |  | 5.156 | CAF2 | 1.55929 | 104.9 |
|  | 13 | 146.169 |  | 33.444 |  |  | 107.4 |
| L907 | 14 | −89.895 |  | 5.075 | CAF2 | 1.55929 | 110.9 |
|  | 15 | 4442.621 | A | 19.655 |  |  | 139.1 |
| L908 | 16 | −410.945 |  | 30.290 | CAF2 | 1.55929 | 163.3 |
|  | 17 | −137.974 |  | 0.728 |  |  | 174.3 |
| L909 | 18 | −3672.717 | A | 50.074 | CAF2 | 1.55929 | 216.0 |
|  | 19 | −178.915 |  | 0.858 |  |  | 225.4 |
| L910 | 20 | −328.339 |  | 21.296 | CAF2 | 1.55929 | 233.7 |
|  | 21 | −242.132 |  | 2.241 |  |  | 239.7 |

TABLE 6-continued

| | | | | | | | |
|---|---|---|---|---|---|---|---|
| L911 | 22 | 669.140 | | 40.591 | CAF2 | 1.55929 | 250.9 |
| | 23 | 1134.597 | | 8.539 | | | 251.4 |
| L912 | 24 | 1120.864 | | 50.723 | CAF2 | 1.55929 | 252.7 |
| | 25 | −277.142 | | 2.564 | | | 252.9 |
| L913 | 26 | 139.965 | | 56.407 | CAF2 | 1.55929 | 204.4 |
| | 27 | 3594.993 | A | 0.775 | | | 188.3 |
| L914 | 28 | 1091.386 | | 6.376 | CAF2 | 1.55929 | 184.8 |
| | 29 | 133.428 | | 14.424 | | | 155.2 |
| L915 | 30 | 224.617 | | 6.039 | CAF2 | 1.55929 | 152.6 |
| | 31 | 173.750 | | 28.970 | | | 145.4 |
| L916 | 32 | −240.401 | | 6.858 | CAF2 | 1.55929 | 143.8 |
| | 33 | 100.188 | A | 56.079 | | | 134.4 |
| L917 | 34 | −107.157 | | 5.000 | CAF2 | 1.55929 | 138.2 |
| | 35 | 1180.415 | | 20.533 | | | 168.7 |
| L918 | 36 | −455.929 | | 26.338 | CAF2 | 1.55929 | 184.6 |
| | 37 | −203.943 | | 0.700 | | | 197.5 |
| L919 | 38 | −610.281 | | 25.757 | CAF2 | 1.55929 | 219.2 |
| | 39 | −224.832 | | 0.700 | | | 224.5 |
| L920 | 40 | −726.132 | | 23.149 | CAF2 | 1.55929 | 241.5 |
| | 41 | −288.704 | | 0.700 | | | 245.3 |
| L921 | 42 | 780.623 | | 36.936 | CAF2 | 1.55929 | 264.3 |
| | 43 | −436.150 | | 0.752 | | | 265.2 |
| | 44 | 0.000 | | 0.722 | | | 263.4 |
| | 45 | 0.000 | | 0.700 | | | 263.4 |
| AS | | 0.000 | | 0.000 | | | 263.4 |
| | 46 | 0.000 | | 0.700 | | | 263.5 |
| L922 | 47 | 295.270 | A | 21.201 | CAF2 | 1.55929 | 268.0 |
| | 48 | 551.333 | | 7.906 | | | 266.6 |
| L923 | 49 | 481.452 | | 48.729 | CAF2 | 1.55929 | 265.0 |
| | 50 | −517.262 | | 30.937 | | | 260.8 |
| L924 | 51 | −206.900 | | 16.490 | CAF2 | 1.55929 | 259.0 |
| | 52 | −236.053 | A | 16.298 | | | 262.2 |
| L925 | 53 | −204.068 | A | 9.762 | CAF2 | 1.55929 | 254.6 |
| | 54 | −205.562 | | 1.062 | | | 256.6 |
| L926 | 55 | 215.400 | | 19.883 | CAF2 | 1.55929 | 209.2 |
| | 56 | 312.052 | | 0.919 | | | 201.5 |
| L927 | 57 | 110.301 | | 26.120 | BAF2 | 1.656711 | 176.6 |
| | 58 | 155.100 | | 2.151 | | | 167.3 |
| L928 | 59 | 118.411 | | 29.793 | BAF2 | 1.656711 | 156.2 |
| | 60 | 894.061 | A | 6.680 | | | 148.0 |
| L929 | 61 | 0.000 | | 22.261 | CAF2 | 1.55929 | 139.1 |
| | 62 | 0.000 | | 4.246 | | | 107.2 |
| L930 | 63 | 0.000 | | 21.228 | CAF2 | 1.55929 | 88.7 |
| | 64 | 0.000 | | 8.491 | | | 58.2 |
| IM | | | | | | | |

| | ASPHERICAL CONSTANTS ON SURFACE 2 | ASPHERICAL CONSTANTS ON SURFACE 9 | ASPHERICAL CONSTANTS ON SURFACE 10 |
|---|---|---|---|
| K | 0.00000000E+00 | 1.33118380E+00 | 1.14173310E+00 |
| C1 | 1.32335790E−07 | −2.32667160E−07 | 1.19094220E−07 |
| C2 | −9.85460150E−13 | 4.28700750E−11 | 2.98302820E−11 |
| C3 | 1.00282740E−15 | −2.00750130E−14 | −1.45252440E−14 |
| C4 | 1.22107320E−19 | 5.12946940E−18 | 3.19261350E−18 |
| C5 | 3.54738410E−24 | −9.05918300E−22 | −4.20623560E−22 |
| C6 | −2.04714340E−27 | 7.15431170E−26 | −5.73903940E−26 |
| C7 | 2.75076790E−30 | 1.15658280E−29 | 3.49662760E−29 |

| | ASPHERICAL CONSTANTS ON SURFACE 15 | ASPHERICAL CONSTANTS ON SURFACE 18 | ASPHERICAL CONSTANTS ON SURFACE 27 |
|---|---|---|---|
| K | 0.00000000E+00 | 0.00000000E+00 | 0.00000000E+00 |
| C1 | 1.37996460E−07 | 7.24213120E−09 | 2.30892630E−08 |
| C2 | −2.02113910E−11 | −4.99923940E−13 | −2.42581680E−13 |
| C3 | 1.12517310E−15 | 6.92614390E−18 | −2.71134260E−17 |
| C4 | 4.71610620E−20 | −5.59025420E−22 | 3.91397240E−21 |
| C5 | −3.36746780E−23 | −8.61189590E−26 | −3.08167910E−25 |
| C6 | 5.30513460E−27 | 1.14612300E−29 | 5.40061810E−30 |
| C7 | −2.61868870E−31 | −3.35809840E−34 | 6.77477980E−34 |

| | ASPHERICAL CONSTANTS ON SURFACE 33 | ASPHERICAL CONSTANTS ON SURFACE 47 | ASPHERICAL CONSTANTS ON SURFACE 52 |
|---|---|---|---|
| K | 0.00000000E+00 | −4.21301580E−02 | 0.00000000E+00 |
| C1 | −2.42437220E−08 | 8.81373610E−10 | 4.81272440E−10 |
| C2 | −1.12558070E−11 | 1.39613280E−15 | −3.00061010E−14 |
| C3 | −4.36454300E−16 | −3.21043010E−19 | −1.69001210E−18 |
| C4 | 2.07736570E−20 | −1.11078980E−23 | 1.76203870E−22 |
| C5 | −1.84141050E−23 | 2.09246460E−27 | −8.02256190E−27 |

TABLE 6-continued

| | | | |
|---|---|---|---|
| C6 | 3.95002980E−27 | −5.76976630E−32 | 3.18707070E−32 |
| C7 | −3.93267230E−31 | 3.52561680E−36 | −1.51919260E−35 |

| | ASPHERICAL CONSTANTS ON SURFACE 53 | ASPHERICAL CONSTANTS ON SURFACE 60 |
|---|---|---|
| K | 0.00000000E+00 | 0.00000000E+00 |
| C1 | −6.55568380E−10 | 5.21795000E−08 |
| C2 | 7.02021150E−14 | 2.33712980E−12 |
| C3 | 6.23254780E−18 | −7.59008190E−16 |
| C4 | −4.87965820E−23 | 7.91105170E−20 |
| C5 | −9.94623440E−27 | −1.06388630E−24 |
| C6 | −1.00256080E−31 | −7.22786880E−28 |
| C7 | −1.00310420E−35 | 5.73352770E−32 |

TABLE 11

| LENS | SURFACE | RADIUS [mm] | ASPHERES | THICKNESS [mm] | MATERIAL | REFRACTIVE INDEX | DIAMETER [mm] |
|---|---|---|---|---|---|---|---|
| OB | 0 | | | 27.171 | | | |
| | 1 | 0.000 | | 0.700 | | | 105.0 |
| L801 | 2 | 2546.434 | A | 16.704 | CAF2 | 1.55929 | 106.1 |
| | 3 | −156.230 | | 3.601 | | | 107.3 |
| L1002 | 4 | −122.095 | | 8.730 | CAF2 | 1.55929 | 107.2 |
| | 5 | −133.213 | | 28.552 | | | 109.9 |
| L1003 | 6 | −310.632 | | 12.074 | CAF2 | 1.55929 | 108.3 |
| | 7 | −130.980 | | 14.625 | | | 108.8 |
| L1004 | 8 | −74.510 | | 6.542 | CAF2 | 1.55929 | 107.4 |
| | 9 | −72.903 | A | 2.079 | | | 110.0 |
| L1005 | 10 | −90.823 | A | 5.000 | CAF2 | 1.55929 | 105.4 |
| | 11 | −152.427 | | 3.466 | | | 107.1 |
| L1006 | 12 | −120.865 | | 5.643 | CAF2 | 1.55929 | 107.0 |
| | 13 | 158.326 | | 34.965 | | | 114.1 |
| L1007 | 14 | −90.085 | | 6.350 | CAF2 | 1.55929 | 116.9 |
| | 15 | −6084.151 | A | 20.302 | | | 152.3 |
| L1008 | 16 | −365.844 | | 32.229 | CAF2 | 1.55929 | 176.7 |
| | 17 | −140.411 | | 0.801 | | | 188.0 |
| L1009 | 18 | −4057.737 | A | 50.810 | CAF2 | 1.55929 | 240.9 |
| | 19 | −192.542 | | 0.977 | | | 247.9 |
| L1010 | 20 | −365.780 | | 23.599 | CAF2 | 1.55929 | 260.2 |
| | 21 | −231.457 | | 4.087 | | | 264.0 |
| L1011 | 22 | 683.188 | | 11.520 | CAF2 | 1.55929 | 278.5 |
| | 23 | 1102.470 | | 0.703 | | | 278.5 |
| L1012 | 24 | 1043.862 | | 52.509 | CAF2 | 1.55929 | 278.7 |
| | 25 | −293.630 | | 0.713 | | | 278.6 |
| L1013 | 26 | 136.873 | | 59.195 | CAF2 | 1.55929 | 215.9 |
| | 27 | 4572.925 | A | 0.701 | | | 204.3 |
| L1014 | 28 | 1246.836 | | 6.921 | CAF2 | 1.55929 | 199.7 |
| | 29 | 152.172 | | 13.509 | | | 165.4 |
| L1015 | 30 | 295.885 | | 5.002 | CAF2 | 1.55929 | 164.5 |
| | 31 | 180.315 | | 31.845 | | | 154.2 |
| L1016 | 32 | −222.432 | | 5.422 | CAF2 | 1.55929 | 153.2 |
| | 33 | 102.356 | A | 59.517 | | | 141.3 |
| L1017 | 34 | −107.225 | | 8.077 | CAF2 | 1.55929 | 144.0 |
| | 35 | 1313.295 | | 20.493 | | | 178.6 |
| L1018 | 36 | −433.077 | | 27.617 | CAF2 | 1.55929 | 191.2 |
| | 37 | −203.032 | | 1.089 | | | 204.4 |
| L1019 | 38 | −671.650 | | 26.431 | CAF2 | 1.55929 | 228.3 |
| | 39 | −244.475 | | 1.461 | | | 234.0 |
| L1020 | 40 | −896.420 | | 24.702 | CAF2 | 1.55929 | 251.5 |
| | 41 | −300.437 | | 2.774 | | | 254.7 |
| L1021 | 42 | 806.227 | | 42.363 | CAF2 | 1.55929 | 272.4 |
| | 43 | −433.663 | | 0.700 | | | 273.6 |
| | 44 | 0.000 | | 0.700 | | | 269.9 |
| | 45 | 0.000 | | 0.700 | | | 269.8 |
| AS | | 0.000 | | 0.000 | | | 269.8 |
| | 46 | 0.000 | | 0.729 | | | 269.8 |
| L1022 | 47 | 276.696 | A | 19.411 | CAF2 | 1.55929 | 272.3 |
| | 48 | 416.325 | | 3.396 | | | 270.2 |
| L1023 | 49 | 320.683 | | 47.143 | CAF2 | 1.55929 | 268.2 |
| | 50 | −699.872 | | 31.698 | | | 266.0 |
| L1024 | 51 | −234.100 | | 22.980 | CAF2 | 1.55929 | 261.2 |
| | 52 | −254.781 | A | 17.312 | | | 260.9 |
| L1025 | 53 | −211.124 | A | 9.519 | CAF2 | 1.55929 | 249.5 |
| | 54 | −223.568 | | 1.505 | | | 250.4 |

TABLE 11-continued

| | | | | | | | |
|---|---|---|---|---|---|---|---|
| L1026 | 55 | 191.095 | | 18.637 | CAF2 | 1.55929 | 197.8 |
| | 56 | 269.437 | | 1.222 | | | 190.0 |
| L1027 | 57 | 105.045 | | 25.832 | CAF2 | 1.55929 | 165.2 |
| | 58 | 168.796 | | 2.678 | | | 157.6 |
| L1028 | 59 | 113.532 | | 32.402 | CAF2 | 1.55929 | 142.8 |
| | 60 | 651.732 | A | 7.090 | | | 124.5 |
| L1029 | 61 | 0.000 | | 11.270 | BAF2 | 1.656711 | 109.8 |
| | 62 | 0.000 | | 0.000 | | | 95.0 |
| L1030 | 63 | 0.000 | | 25.000 | CAF2 | 1.55929 | 95.0 |
| | 64 | 0.000 | | 8.491 | | | 59.4 |
| IM | | | | | | | |

| | ASPHERICAL CONSTANTS ON SURFACE 2 | ASPHERICAL CONSTANTS ON SURFACE 9 | ASPHERICAL CONSTANTS ON SURFACE 10 |
|---|---|---|---|
| K | 0.00000000E+00 | 1.33118380E+00 | 1.14173310E+00 |
| C1 | 1.40182630E−07 | −4.02107060E−07 | 9.24507150E−08 |
| C2 | 4.56121550E−12 | 1.82588750E−11 | 6.29142990E−12 |
| C3 | −2.50509460E−16 | −2.19642170E−14 | −1.69557480E−14 |
| C4 | 2.59565170E−19 | 4.56698550E−18 | 3.70886200E−18 |
| C5 | −1.24088700E−22 | −7.65801330E−22 | −5.08598010E−22 |
| C6 | 2.53035580E−26 | 7.31294330E−26 | 2.53753080E−26 |
| C7 | −2.36856230E−30 | −6.47006230E−30 | 3.86765630E−30 |

| | ASPHERICAL CONSTANTS ON SURFACE 15 | ASPHERICAL CONSTANTS ON SURFACE 18 | ASPHERICAL CONSTANTS ON SURFACE 27 |
|---|---|---|---|
| K | 0.00000000E+00 | 0.00000000E+00 | 0.00000000E+00 |
| C1 | 1.34482780E−07 | 6.71021320E−09 | 2.22467540E−08 |
| C2 | −2.18216930E−11 | −5.10533410E−13 | −4.17146870E−13 |
| C3 | 1.15163150E−15 | −4.36482720E−18 | −4.69588840E−17 |
| C4 | 4.66656370E−20 | −3.28282990E−22 | 4.66821820E−21 |
| C5 | −2.28308330E−23 | 4.72446260E−26 | −3.37448840E−25 |
| C6 | 2.87365150E−27 | −1.19631410E−30 | 1.39965110E−29 |
| C7 | −1.42316790E−31 | −2.83595940E−36 | −1.76152380E−34 |

| | ASPHERICAL CONSTANTS ON SURFACE 33 | ASPHERICAL CONSTANTS ON SURFACE 47 | ASPHERICAL CONSTANTS ON SURFACE 52 |
|---|---|---|---|
| K | 0.00000000E+00 | −4.21301580E−02 | 0.00000000E+00 |
| C1 | −3.49525610E−08 | 9.29715380E−10 | 6.12781970E−11 |
| C2 | −1.12097540E−11 | −1.15553520E−14 | −2.08321780E−14 |
| C3 | −1.70985170E−16 | 1.90041590E−19 | −1.19015800E−18 |
| C4 | −1.42030190E−20 | 1.23471910E−23 | 1.02492310E−22 |
| C5 | −8.26941010E−24 | 2.02625000E−27 | −8.93898820E−27 |
| C6 | 1.47418090E−27 | −7.86324910E−32 | 2.52614680E−31 |
| C7 | −1.52755100E−31 | 3.76208740E−36 | −7.75862680E−36 |

| | ASPHERICAL CONSTANTS ON SURFACE 53 | ASPHERICAL CONSTANTS ON SURFACE 60 |
|---|---|---|
| K | 0.00000000E+00 | 0.00000000E+00 |
| C1 | −1.00897430E−10 | 3.96943500E−08 |
| C2 | 5.45038720E−14 | 3.01989880E−12 |
| C3 | 4.43934360E−18 | −7.26918700E−16 |
| C4 | −2.31755050E−23 | 6.55738330E−20 |
| C5 | −9.36083370E−27 | −1.11109060E−24 |
| C6 | 1.56231030E−31 | −4.98714850E−28 |
| C7 | −3.51254830E−36 | 4.29535300E−32 |

What is claimed is:

1. A method of making lenses from at least a first plate of a first crystalline material and a second plate of a second crystalline material, said method comprising:
    joining the first plate and the second plate to form a unitary blank with an optically seamless joint,
    shaping and polishing the blank into a lens,
    wherein the crystalline materials, the crystallographic orientations, and the plate thicknesses are selected so that for a light ray that is subject in the first plate to a first optical path difference between two mutually orthogonal states of linear polarization, and in the second plate to a second optical path difference between two mutually orthogonal states of linear polarization, the first and second optical path difference approximately compensate each other.

2. The method of making lenses according to claim 1, wherein the optically seamless joint comprises a wringing fit.

3. The method of making lenses according to claim 1, wherein the first crystalline material comprises calcium fluoride and the second crystalline material comprises barium fluoride.

4. The method of making lenses according to claim 1,
    wherein the first plate has a first normal vector and the second plate has a second normal vector;
    wherein each of the crystalline materials has a plurality of principal crystallographic directions, said plurality including principal crystallographic directions being equivalent to one another; and
    wherein said first and second normal vectors are aligned approximately in one of a single principal crystallographic direction and principal crystallographic directions equivalent to said single principal crystallographic direction.

5. The method of making lenses according to claim 4, wherein said single principal crystallographic direction is one of the crystallographic direction <100> and an equivalent to the crystallographic direction <100>.

6. The method of making lenses according to claim 4, wherein said single principal crystallographic direction is one of the crystallographic direction <111> and an equivalent to the crystallographic direction <111>.

7. The method of making lenses according to claim 4, wherein said equivalent principal crystallographic directions in the two plates are oriented in approximately equal directions.

8. The method of making lenses according to claim 4,
wherein the first plate has a first thickness and the second plate has a second thickness;
wherein the crystalline material of the first plate has a first birefringence index for the crystallographic direction <110> and the crystalline material of the second plate has a second birefringence index for the crystallographic direction <110>; and
wherein the ratio of the first thickness to the second thickness is approximately the reciprocal of the ratio of the first birefringence index to the second birefringence index.

9. A lens made by the method of claim 1.

10. An objective comprising at least one lens according to claim 9.

11. A microlithography projection apparatus comprising an illumination system, and further comprising the objective of claim 10.

* * * * *